United States Patent
Nakamura

(10) Patent No.: US 6,192,330 B1
(45) Date of Patent: Feb. 20, 2001

(54) METHOD AND APPARATUS FOR STRING MODEL SIMULATION OF A PHYSICAL SEMICONDUCTOR PROCESS INCLUDING USE OF SPECIFIC DEPTH ANGLES AND SEGMENT LIST WITH REMOVAL OF REDUNDANT SEGMENTS

(75) Inventor: Mitsutoshi Nakamura, Kanagawa-ken (JP)

(73) Assignee: Kabushiki Kaisha Toshiba, Kawasaki (JP)

(*) Notice: Under 35 U.S.C. 154(b), the term of this patent shall be extended for 0 days.

(21) Appl. No.: 09/152,390

(22) Filed: Sep. 14, 1998

(30) Foreign Application Priority Data

Sep. 14, 1997 (JP) .................................................. 9-268142

(51) Int. Cl.[7] ................................................ H01L 21/363
(52) U.S. Cl. ................................ 703/13; 703/14; 703/2; 703/3; 703/6; 716/19
(58) Field of Search ................................. 703/13, 14, 12, 703/2; 364/578; 395/500–21

(56) References Cited

U.S. PATENT DOCUMENTS

| | | | |
|---|---|---|---|
| 5,070,469 | * 12/1991 | Kunikiyo et al. | 364/578 |
| 5,293,557 | * 3/1994 | Fujinaga et al. | 364/578 |
| 5,379,225 | * 1/1995 | Tazawa et al. | 364/578 |
| 5,421,934 | * 6/1995 | Misaka et al. | 216/59 |
| 5,556,525 | * 9/1996 | Krivokapic et al. | 204/192.12 |
| 5,644,688 | * 7/1997 | Leon et al. | 395/120 |
| 5,745,388 | * 4/1998 | Mimotogi et al. | 364/578 |
| 5,751,607 | * 5/1998 | Ohta | 364/578 |
| 5,812,435 | * 9/1998 | Fujinaga | 364/578 |
| 5,815,684 | * 9/1998 | Ohta et al. | 713/502 |
| 5,889,680 | * 3/1999 | Yokota | 364/468.28 |
| 5,983,011 | * 11/1999 | Yamada et al. | 395/500.35 |
| 6,009,255 | * 12/1999 | Shinzawa | 395/500.27 |

* cited by examiner

Primary Examiner—Kevin J. Teska
Assistant Examiner—William Thomson
(74) Attorney, Agent, or Firm—Foley & Lardner

(57) ABSTRACT

A simulation method and a simulation apparatus suppress a parabolic increase in depth angle calculation time to a linear increase at most with respect to an increase in the number of depth angle calculation points on a surface string that represents a processing surface to be simulated. The simulation method and apparatus are applicable to a deposition process that deposits metal such as aluminum on a semiconductor substrate in a vacuum with the use of physical adsorption. The simulation method and apparatus are effective, in particular, to quickly calculate depth angles on a two-dimensional shape to a processing surface to which the deposition process is applied. The depth angles are angles in which particles fly toward the processing surface during the deposition process. The simulation method and apparatus trace a surface string representing the processing surface from the origin to the terminal thereof and find depth angles at all points on the surface string. If a supplement of adjacent segments on the surface string is negative, a depth angle at a node of the adjacent segments is calculated at once according to the supplement and a maximum or minimum angle already found at the preceding point. If a depth angle at a given point is not calculable based on the preceding point, a point that determines the depth angle is found in a segment list according to a bisection method.

18 Claims, 21 Drawing Sheets

DATA FORMAT OF SEGMENT LIST

SEGMENT LIST

- 1901 INITIALIZING UNIT FOR MAXIMUM ANGLE CALCULATION
- 1902 CONTROLLER FOR MAXIMUM ANGLE CALCULATION
- 1904 MAXIMUM ANGLE CALCULATOR
- 1903 SUPPLEMENT CALCULATOR
- 1905 INITIALIZING UNIT FOR MINIMUM ANGLE CALCULATION
- 1906 CONTROLLER FOR MINIMUM ANGLE CALCULATION
- 1907 MINIMUM ANGLE CALCULATOR
- 1908 POSTPROCESSOR

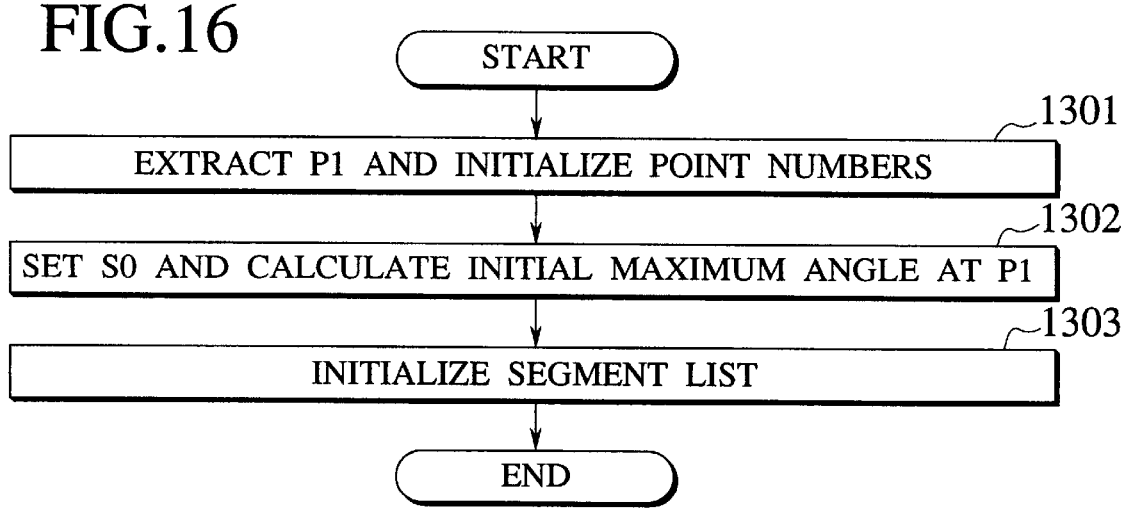
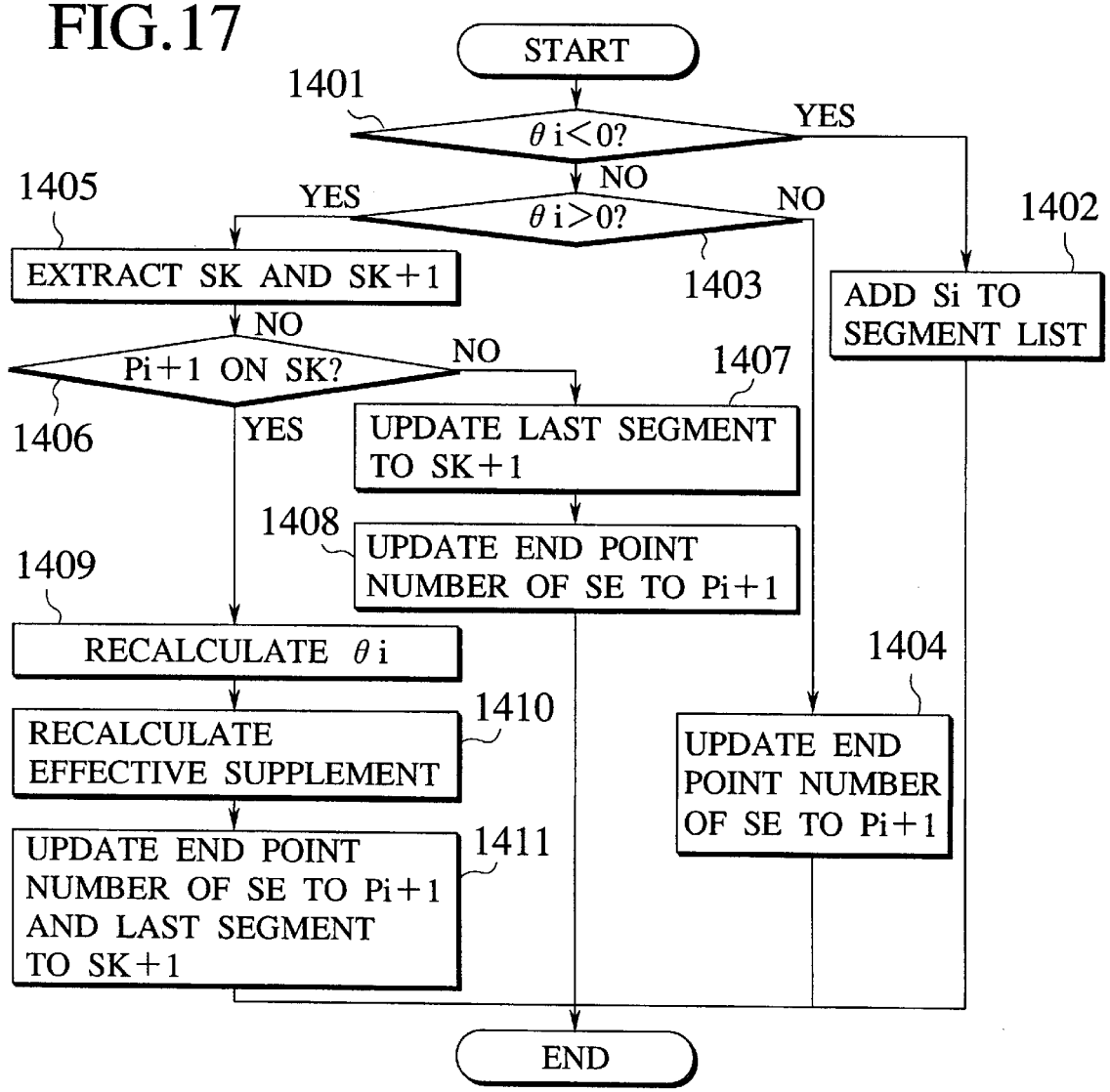

FIG.30A

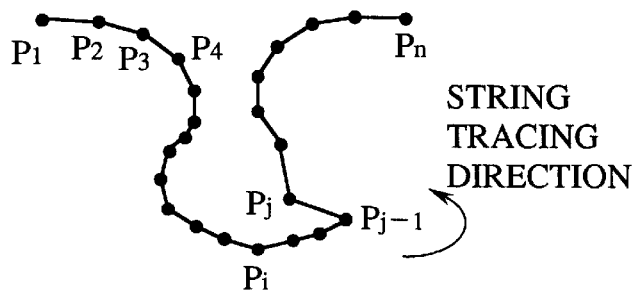

STRING TRACING DIRECTION

FIG.30B

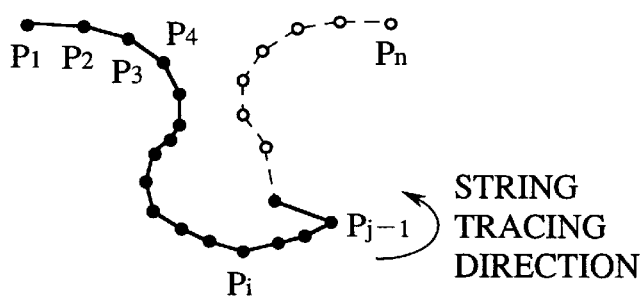

STRING TRACING DIRECTION

FIG.30C

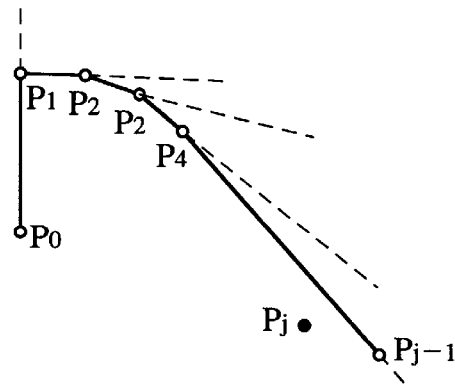

FIG.31

| 2201 INITIALIZING UNIT FOR MAXIMUM ANGLE CALCULATION | 2205 CONVENTIONAL MAXIMUM ANGLE CALCULATOR |
|---|---|
| 2202 CONTROLLER FOR MAXIMUM ANGLE CALCULATION | 2204 MAXIMUM ANGLE CALCULATOR |
| 2206 INITIALIZING UNIT FOR MINIMUM ANGLE CALCULATION | 2203 SUPPLEMENT CALCULATOR |
| 2207 CONTROLLER FOR MINIMUM ANGLE CALCULATION | 2208 MINIMUM ANGLE CALCULATOR |
| 2210 POSTPROCESSOR | 2209 CONVENTIONAL MINIMUM ANGLE CALCULATOR |

METHOD AND APPARATUS FOR STRING MODEL SIMULATION OF A PHYSICAL SEMICONDUCTOR PROCESS INCLUDING USE OF SPECIFIC DEPTH ANGLES AND SEGMENT LIST WITH REMOVAL OF REDUNDANT SEGMENTS

BACKGROUND OF THE INVENTION

1. Field of the Invention

The present invention relates to recognizing and simulating two-dimensional shapes in evaluating semiconductor elements. In particular, the present invention relates to a simulation method and a simulation apparatus that are used to calculate effective angles (hereinafter referred to as incident angles) on a semiconductor element. The incident angles are used to simulate particles flying toward the surface of the semiconductor element during the manufacturing thereof.

2. Description of the Prior Art

Semiconductor elements and semiconductor integrated circuit devices are mass-produced after making and evaluating experimental pieces. FIG. 1 is a flowchart showing steps to produce an experimental piece of a semiconductor element. Basic circuits, circuit cells, and processes are designed. Based on the designs, experimental pieces are produced and evaluated in their electric characteristics, etc. If they show good results, the semiconductor element is mass-produced. If the evaluation results are not good, the circuits and/or the processes are redesigned. These steps are repeated to provide satisfactory products. When designing processes and making experimental pieces, process simulations are carried out, and when evaluating the experimental pieces, device simulations are carried out, to improve the quality and performance of semiconductor products.

When designing a semiconductor element, it is necessary to evaluate the electric characteristics of the element, which are dependent on the shape and impurity distribution of the element. To measure the electric characteristics of a semiconductor element, it is usual to make experimental pieces of the element. Preparing such experimental pieces needs a lot of time and labor, and therefore, deteriorates the developing efficiency of semiconductor elements. Semiconductor elements are very fine, and therefore, evaluating experimental pieces by manpower is substantially impossible.

To solve these problems, there is a technique of sampling the shape of a semiconductor element by scanning-electron microscope, preparing shape data from the sample according to image processing technology, and using the shape data on a computer to evaluate semiconductor elements. There is another technique that employs a computer to manipulate the shapes of semiconductor elements from the beginning. These techniques are used to simulate, evaluate, and analyze semiconductor elements and element manufacturing processes.

S. M. Sze has disclosed a process simulation technique in "VLSI Technology" McGraw-Hill, 1993. This technique defines a two-dimensional calculation window on a semiconductor element. The window is divided into a material region where solid material is present and a vacuum region where a vacuum or gas is present. The process simulation takes place on each of these regions. FIG. 2 is a cross sectional view showing a simulation result of a transistor formed on a semiconductor substrate. The substrate shows impurity distributions. The transistor is a MOS transistor whose gate 1 is formed on the substrate. The gate 1 is covered with an insulation film 2, on which a metal wire 3 of, for example, aluminum is formed.

A technique that simulates changes in the shape of a material region defined in a calculation window is called a shape simulation. Among shape simulation techniques, a technique that carries out a simulation based on a string model defined along a boundary between the material and vacuum regions of a calculation window is a two-dimensional shape simulation. FIG. 3 shows an example of a string model. A string 501 consists of a series of segments Si each of which extends between adjacent points (Pi-1, Pi). The string 501 defines a two-dimensional material shape 502. Data necessary for expressing the string 501 are sequential point numbers or sequential segment numbers, the coordinates of points, and an array number. The origin of the array may be any one of the points on the string 501, and therefore, the handling of the string 501 is easy.

FIG. 4A is a cross sectional view showing an intermediate part between gates of MOS transistors. A square 1501 is sampled to prepare a string model of FIG. 4B. A material region 1503 and a vacuum region 1502 are each represented with a series of points and/or segments.

When simulating surface changes during a deposition or etching process, a surface string 1504 of FIG. 4C between the vacuum region 1502 and the material region 1503 is defined. This is because the deposition or etching process affects only the surface of a semiconductor substrate. A sequence of points on the string 1504 usually follows a sequence of points of the vacuum region 1502. This is to make the handling of the string 1504 simpler when several material regions are facing the surface. Once a sequence of points along the vacuum region 1502 is determined as shown in FIG. 4C, a boundary point that is in contact with the calculation window 1501, vacuum region 1502, and material region 1503 is searched for from a border point A at the upper right corner of the calculation window 1501 toward the boundary of the vacuum region 1502. This easily and quickly finds an origin of the string 1504 between the regions 1502 and 1503.

The shape simulation carried out on the string 1504 simulates, for example, changes to occur along the string 1504 during a deposition process that deposits metal such as aluminum on the material region 1503 in a vacuum due to physical adsorption. During the simulation, every point on the string 1504 has a different effective angle (incident angle) within which particles may fly toward the point. Accordingly, a depth angle calculation must be carried out on every point Pi on the string 1504. FIG. 5 explains a depth angle at a point Pi on a given string between a vacuum region and a material region.

FIG. 6 shows the definition of the depth angle. A depth angle at a point Pi on a given string is defined around a reference line that extends vertically from the point Pi. The reference line is orthogonal to a horizontal line as shown in the right part of FIG. 6. The depth angle is the sum of absolute values of a minimum angle θmin and a maximum angle θmax. In this specification, the sign of an angle is positive in a counterclockwise direction from a reference line and negative in a clockwise direction from the reference line.

FIG. 7 is a block diagram showing a shape simulation apparatus. The apparatus has a data reader 201, a process controller 202, and a result output unit 203. The data reader 201 reads a semiconductor process flow and converts it into data to be handled by the process controller 202. The process controller 202 repeatedly operates simulators according to a sequence of manufacturing processes. The manufacturing processes include a lithography process to be simulated by a lithography simulator 204, a CMP process to be simulated by a CMP simulator 205, an etching process to be simulated by an etching simulator 206, and a deposition process to be simulated by a deposition simulator 207. Simulation results and intermediate results are output to a display or a printer through the result output unit 203.

FIG. 8 shows the structure of the deposition simulator 207 of FIG. 7. The deposition simulator 207 has a controller 301. The controller 301 receives data from the process controller 202, transfers data among parts controlled by the controller 301, and updates time counters. Among the parts controlled by the controller 301, a surface string extractor 302 extracts a surfaces string between a vacuum region and a material region according to the technique mentioned above. A depth angle calculator 303 calculates a depth angle at each point on the surface string according to calculation methods to be explained later. A shift calculator 304 calculates a shift of each boundary point according to the calculations made by the depth angle calculator 303. A shifter 305 shifts the boundary points according to the calculations made by the shift calculator 304. An abnormal shape processor 306 corrects abnormal shapes such as loops and extraterritorial protrusions that occur when the shifter 305 shifts the boundary points.

FIG. 9 shows a conventional technique employed by the depth angle calculator 303 of FIG. 8. A depth angle at a point Pi is the sum of absolute values of a maximum angle θmax and a minimum angle θmin with respect to a reference line extending from the point Pi. The maximum angle θmax is a minimum of angles defined by the reference line and points ranging from the point Pi to an origin P1. The minimum angle min is a maximum of angles defined by the reference line and points ranging from the point Pi to a terminal Pn.

FIG. 10 is a block diagram showing the structure of the depth angle calculator 303 of FIG. 8. The depth angle calculator 303 has an initializing unit 401, a calculation controller 402, and a postprocessor 405. The initializing unit 401 sets an origin and a terminal among a series of points on a given surface string, as well as a first point where a depth angle is calculated at first. The calculation controller 402 traces the string from the origin to the terminal and stores minimum and maximum angles calculated at each point on the string. A maximum calculator 403 finds for a point Pi a minimum of angles defined by a reference line and points ranging from the point Pi to the origin, to provide a maximum angle at the point Pi. A minimum calculator 403 finds for a point Pi a maximum of angles defined by a reference line and points ranging from the point Pi to the terminal, to provide a minimum angle at the point Pi. The postprocessor 405 handles maximum and minimum angles that are out of criteria.

FIG. 11 is a flowchart showing the details of the depth angle calculating technique according to the prior art. There are 15 steps between "Start" and "End." Step 901 corresponds to the initializing unit 401, steps 902 to 906 to the maximum calculator 403, steps 907 to 911 to the minimum calculator 404, steps 912 to 914 to the calculation controller 402, and step 915 to the postprocessor 405.

Step 901 carries out initialization for calculating depth angles. More precisely, for a given surface string along which depth angles are going to be calculated, step 901 sets an origin P1, a terminal Pn, a target point Pi (at the origin P1 at first), a maximum angle of a depth angle at the origin P1 according to boundary conditions, and a minimum angle of a depth angle at the terminal Pn according to the boundary conditions.

Step 902 sets a maximum angle search point PL at the target point Pi, calculates an angle θ defined by a segment between points PL-1 and Pi and a reference line passing through the point Pi, and initializes an integrated value Σθ to θ and a maximum angle θmax to θ.

Step 903 checks to see if the search point PL is equal to the origin P1. If they are equal to each other, step 907 is carried out, and if not, step 904 sets a next search point PL-1 on the origin side of the search point PL. Step 905 calculates an angle Δθ defined by a segment between the points Pi and PL and a segment between the points Pi and PL-1. Step 906 updates the integrated value Σθ to the sum of Δθ and Σθ. If Σθ is smaller than θ max, θmax is updated to Σθ and PL to PL-1. Then, the flow returns to step 903. Steps 903 to 906 are repeated until step 903 becomes true.

Step 907 sets a minimum angle search point PR to the target point Pi, calculates an angle 0 defined by a segment between points PR+1 and Pi and the reference line passing through the point: Pi, and initializes the integrated value Σθ to θ and a minimum angle θmin to θ.

Step 908 checks to see if the search point PR is equal to the terminal Pn. If they are equal to each other, the flow advances to step 912. If they are not equal to each other, step 909 sets a next search point PR+1 on the terminal side of the search point PR. Step 910 calculates an angle Δθ defined by a segment between the points Pi and PR and a segment between the points Pi and PR+1. Step 911 updates the integrated value Σθ to the sum of Σθ and Δθ, and if Σθ is larger than θmin, updates θmin to Σθ and PR to PR+1. Then, the flow returns to step 908, and steps 908 to 911 are repeated until step 908 becomes true.

Step 912 saves the maximum angle θmax and minimum angle θmin calculated in steps 902 to 911 to determine a depth angle at the point Pi.

Step 913 checks to see if the point Pi is equal to the terminal Pn. If they are equal to each other, step 915 is carried out, and if not, step 914 advances the point Pi by one toward the terminal Pn, and the flow returns to step 902. Steps 902 to 914 are repeated until step 913 determines that the point Pi is equal to the terminal Pn. Step 915 processes θmax and θmin that are out of criteria (for example, θmin>θmax), and the flow ends.

When the number "n" of points on a given surface string increases, the number of calculations the prior art must carry out increases. Namely, the number of calculations of the prior art is dependent on time necessary for repeating steps 902 to 914. Steps 902 to 914 involve double loops and require "n" operations for tracing a string from an origin to a terminal thereof and "n−1" operations for calculating θmin and θmax for a depth angle at each point on the string. Accordingly, the prior art must carry out $n^2$ operations, i.e., $O(n^2)$ as a whole. The number of other operations is less than $O(n)$. Consequently, calculation time by the prior art parabolically increases as the number of points on a given string increases. If the number of points on a string is several thousands, the calculation time will be extremely large.

FIG. 12 shows a graph showing calculation time with respect to various numbers of points on a surface string according to the prior art, with 145 points being set as 1. This graph is based on the surface string of FIG. 4C. The calculation time in the graph is dimensionless. As is apparent in the graph, the prior art parabolically increases calculation time as the number of points increases.

To correctly express a two-dimensional shape with a string model, the number of points to plot the string must sufficiently be large. In particular, to express material and vacuum regions having intricate shapes, the number of points on a string must be several hundreds to several thousands to eliminate the influence of tolerance in the sizes of simulation areas and in expressing shapes. For correctly simulating a deposition process to deposit metal such as aluminum on a substrate having a complicated surface shape, several hundreds to several thousands of points are needed to express a string model of the substrate surface. This parabolically increases the depth angle calculation time of the prior art. In this case, the prior art is hardly a practical solution.

During the deposition process, the shape of a surface varies every moment. To cope with this, the shape is simulated by dividing a deposition time into shorter intervals at which depth angle calculations are repeated. In this case, a parabolic increase in the depth angle calculation time of the prior art causes a serious problem.

SUMMARY OF THE INVENTION

An object of the present invention is to provide a method of and an apparatus for calculating depth angles on a surface string, capable of suppressing a parabolic increase in depth angle calculation time to a linear increase at most with respect to an increase in the number of depth angle calculation points on the surface string.

Another object of the present invention is to provide a simulation method and a simulation apparatus for correctly and speedily simulating, for example, a deposition process to deposit metal such as aluminum on a substrate in a vacuum with the use of physical adsorption.

Still another object of the present invention is to provide a method of and an apparatus for speedily calculating depth angles on a two-dimensional shape of a semiconductor material in simulating a deposition process that deposits metal such as aluminum on the semiconductor material in a vacuum with the use of physical adsorption. The depth angles are necessary to simulate particles flying to the surface of the semiconductor material during the deposition process.

In order to accomplish the objects, the present invention traces a string that represents the surface of a material from an origin to a terminal of the string and calculates a depth angle at each point on the string. If a depth angle at a target point on the string is determined by the preceding point on the string, the present invention immediately calculates the depth angle at the target point and stores a segment between the target point and the preceding point in a segment list. If the preceding point does not determine a depth angle at the target point, the present invention finds a point that determines the depth angle for the target point in the segment list according to a bisection method and calculates the depth angle accordingly. At this time, the present invention defines a new segment between the found point and the target point, stores the new segment in the segment list, and removes redundant segments from the segment list. After carrying out these processes by tracing the string from the origin to the terminal thereof, the present invention carries out the same processes by tracing the string from the terminal to the origin. The present invention is capable of minimizing the number of segments stored in the segment list used by the bisection method and reducing the number of operations for calculating depth angles at all points on a given string to $O(n \cdot \log(m))$ ($n > m$) where "n" is the number of points at which depth angles are calculated and "m" is the number of strings stored in the string list. This number of operations is quite smaller than $O(n \cdot \log(n))$ of the conventional bisection technique. In this specification, a base of logarithm is 2.

BRIEF DESCRIPTION OF THE DRAWINGS

FIG. 16 is a flowchart showing the details of step 1201 of FIG. 15;

FIG. 17 is a flowchart showing the details of step 1203 of FIG. 15;

FIGS. 30A to 30C show a case that needs the conventional depth angle calculation technique;

FIG. 31 is a block diagram showing a depth angle calculation apparatus according to a second embodiment of the present invention;

DETAILED DESCRIPTION OF THE EMBODIMENTS

Various embodiments of the present invention will be described with reference to the accompanying drawings. In the following explanation, an assumption is made that a string shown in FIG. 22 is already presented by simulations. The string represents the surface of, for example, a semiconductor element. The present invention calculates a depth angle at every point on the string at high speed. The calculated depth angles are used to simulate physical processes applied to the surface.

The physical processes for which the present invention is effective are those that make particles directly hit the surface of a material. For example, the present invention is effective to physical processes carried out in a vacuum, such as a vacuum vapor deposition process that deposits metal such as aluminum on a material with the use of physical adsorption, a spattering process that spatters refractory metal such as Ti and W on a material, and an RIE (reactive ion etching) process.

The first embodiment of the present invention will be explained with reference to FIGS. 14 to 21 and 35.

Figure 35:
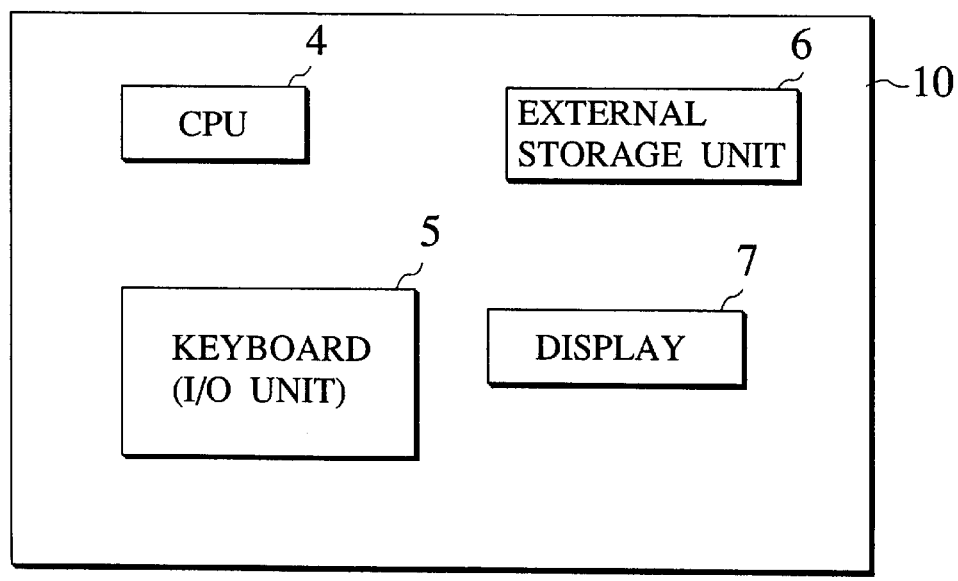
FIG. 35 is a block diagram showing an apparatus for achieving the present invention.

In FIG. 35, an apparatus 10 for carrying out simulations and calculations according to the present invention is a standard computer system. The computer system includes a CPU (central processing unit) 4 for carrying out various processes, an I/O unit 5 such as a key board, an external storage unit 6 such as a memory and a disk drive, and an output unit 7 such as a display. Operations to execute the present invention are mainly achieved by the CPU 4. A program for managing the steps of the present invention is compiled beforehand and is stored in the external storage unit 6. The program is loaded to a memory of the apparatus 10 and is executed.

Figures 13, 14:
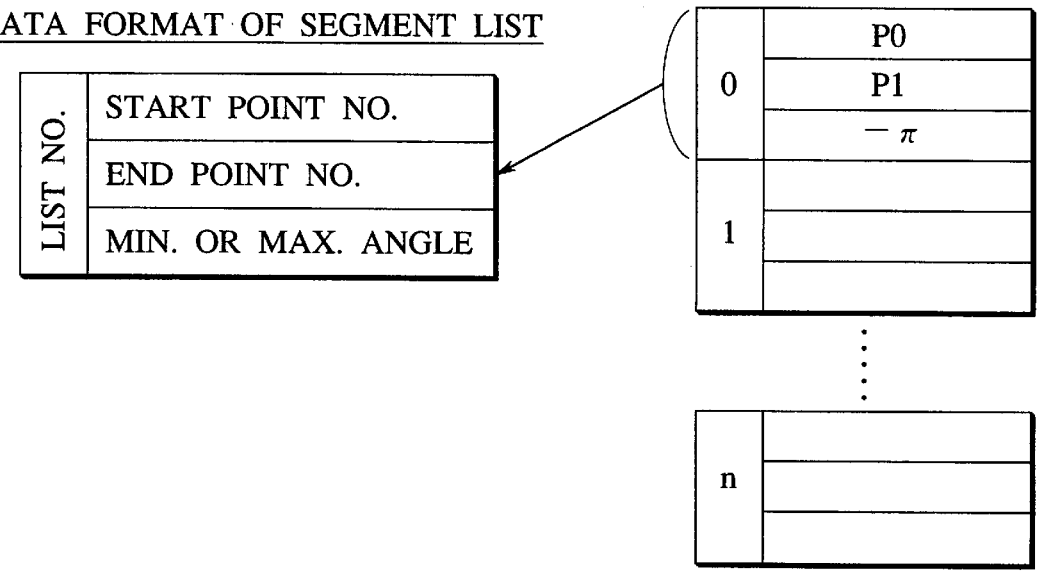
FIG. 13 shows a segment list employed by a depth angle calculation method according to the present invention.
FIG. 14 is a block diagram showing a simulation system according to a first embodiment of the present invention.

A depth angle to be calculated at every point on a given surface string is composed of a maximum angle and a minimum angle. These angles are calculated according to segments of the string. The segments are stored in a segment list. These data pieces are stored in registers of the CPU 4 and in the external storage unit 6. FIG. 13 shows an example of the segment list. The segment list stores, for each segment, a start point number, an end point number, and a minimum or maximum angle at an end point.

FIG. 14 is a block diagram showing a simulation system according to the first embodiment of the present invention. The system has an initializing unit 1901 for maximum angle calculation, a controller 1902 for maximum angle calculation, a supplement calculator 1903, a maximum angle calculator 1904, an initializing unit 1905 for minimum angle calculation, a controller 1906 for minimum angle calculation, a minimum angle calculator 1907, and a postprocessor 1908.

The initializing unit 1901 for maximum angle calculation extracts an origin of a given surface string and prepares a segment list used to calculate maximum angles. The controller 1902 for maximum angle calculation controls the tracing of the string from the origin to a terminal thereof and saves maximum angles calculated at points on the string. The supplement calculator 1903 calculates a supplement of two segments. The maximum angle calculator 1904 calculates supplements used to calculate maximum angles, updates the segment list, and adds segments to the list.

The initializing unit 1905 for minimum angle calculation extracts the terminal of the string and prepares a segment list used to calculate minimum angles. The controller 1906 for minimum angle calculation controls the tracing of the string from the terminal to the origin and saves minimum angles calculated at the points on the surface string. The minimum angle calculator 1907 calculates supplements used to calculate minimum angles, updates the segment list, and adds segments to the list. The postprocessor 1908 inverts the signs of the maximum and minimum angles and carries out other operations.

Figure 15:
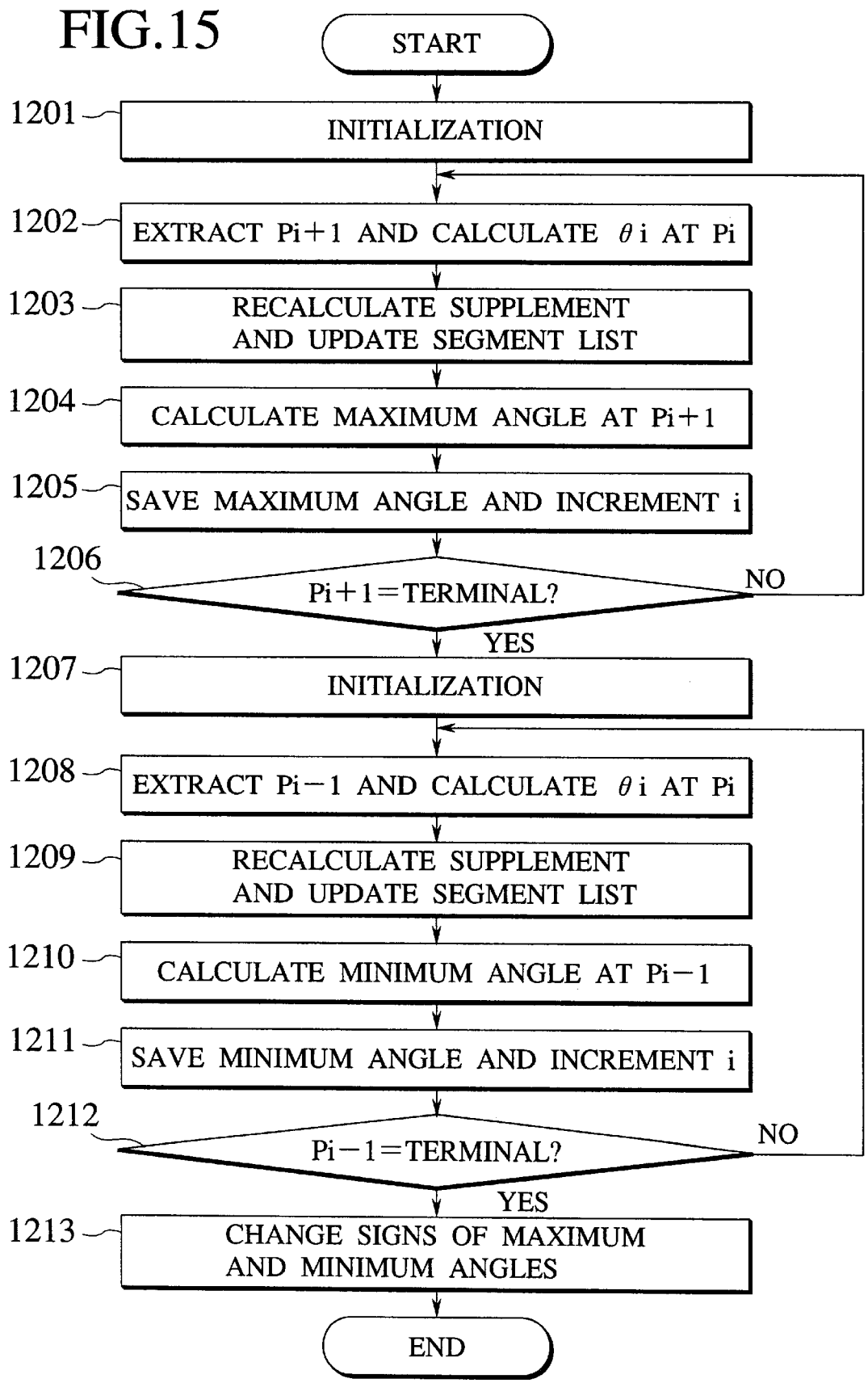
FIG. 15 is a flowchart generally showing a depth angle calculation method according to the first embodiment.

FIGS. 15 to 21 are flowcharts showing a simulation according to the first embodiment, in which FIG. 15 generally shows a flow of simulation and FIGS. 16 to 21 show the details of FIG. 15.

The general flow of simulation according to the first embodiment will be explained with reference to FIG. 15, and then, the details thereof will be explained with reference to FIGS. 16 to 21.

In FIG. 15, step 1201 carries out initialization for tracing a given surface string from an origin to a terminal thereof. Namely, step 1201 prepares a segment list and an initial segment and sets a point number "i" to 1. Step 1202 extracts an "i+1"th point Pi+1 and calculates a supplement $\theta i$ defined by a last segment contained in the segment list and a segment between the points Pi+1 and Pi. Step 1203 recalculates a supplement at the point Pi according to an evaluation of the supplement $\theta i$ and updates the segment list. Step 1204 calculates a maximum angle $\theta Li+1$ at the point Pi+1 as follows:

$$\theta Li+1 = \theta Li - \theta i \quad (1)$$

Step 1205 saves the maximum angle $\theta Li+1$ and increments the point number "i" by one. Step 1206 checks to see if the point Pi+1 is equal to the terminal. Until step 1206 becomes true, steps 1202 to 1205 are repeated. Thereafter, step 1207 is carried out.

Step 1207 carries out initialization for tracing the string from the terminal to the origin. Namely, step 1207 prepares a segment list and an initial segment and sets the point number "i" to "n." Step 1208 extracts an "i-1"th point Pi-1 and calculates a supplement $\theta i$ defined by a last segment in the segment list and a segment between the points Pi-1 and Pi. Step 1209 recalculates a supplement at the point Pi according to an evaluation of the supplement $\theta i$ and updates the segment list. Step 1210 calculates a minimum angle $\theta Ri-1$ at the point Pi-1 as follows:

$$\theta Ri-1 = \theta Ri - \theta i \quad (2)$$

Step 1211 saves the minimum angle $\theta Ri-1$ and decrements the point number "i" by one. Step 1212 checks to see if the point Pi-1 is equal to the origin. Until step 1212 becomes true, steps 1207 to 1211 are repeated. Thereafter, step 1213 is carried out.

Step 1213 inverts the signs of the maximum angle θLi and minimum angle θRi at each point so that they will be in the range of normal values. This is because the first embodiment determines the sign of an angle in a counterclockwise direction, and therefore, the maximum angle is a negative value and the minimum angle is a positive value.

The details of the flowchart of FIG. 15 will be explained with reference to the flowcharts of FIGS. 16 to 21.

FIG. 16 shows the details of step 1201 of FIG. 15. Step 1301 extracts the origin P1 of the surface string and initializes the point number "i" to 1. Step 1302 sets an initial segment S0 according to boundary conditions and calculates a maximum angle θL1 at the point P1. Step 1303 stores the segment S0 in a segment list.

FIG. 17 is a flowchart showing the details of step 1203 of FIG. 15. Step 1401 checks to see if the supplement θi is negative. If it is negative, a start point Pi of a segment Si determines the maximum angle of a point Pi+1. Then, step 1402 adds the segment Si to the segment list, and the flow ends.

If the supplement θi is not negative in step 1401, step 1403 checks to see if the supplement θi is positive. If it is not negative, i.e., if the supplement is zero in step 1403, step 1404 updates the end point number of a last segment SE in the segment list to Pi+1, and the flow ends. If the supplement is negative in step 1403, step 1405 extracts a segment number "k" from the segment list according to the bisection method. Here, the segment number "k" specifies adjacent segments Sk and Sk+1 which are contained in the segment list and whose extensions define an area in which the point Pi+1 is present.

Step 1406 checks to see if the point Pi+1 is on the extension of the segment Sk. If step 1406 is false, step 1407 updates the number "E" of the last segment SE in the segment list to "k+1." Step 1408 updates the end point number of the last segment SE to "Pi+1," and the flow ends.

If the point Pi+1 is on the extension of the segment Sk in step 1406, step 1409 recalculates a supplement θi defined by the start point and end point of the segment Sk and the point Pi+1. Step 1410 recalculates an effective supplement according to a maximum angle saved for the segment Sk and the recalculated supplement θi. Step 1411 updates the number "E" of the last segment SE to "k+1," and the flow ends.

Figure 18:
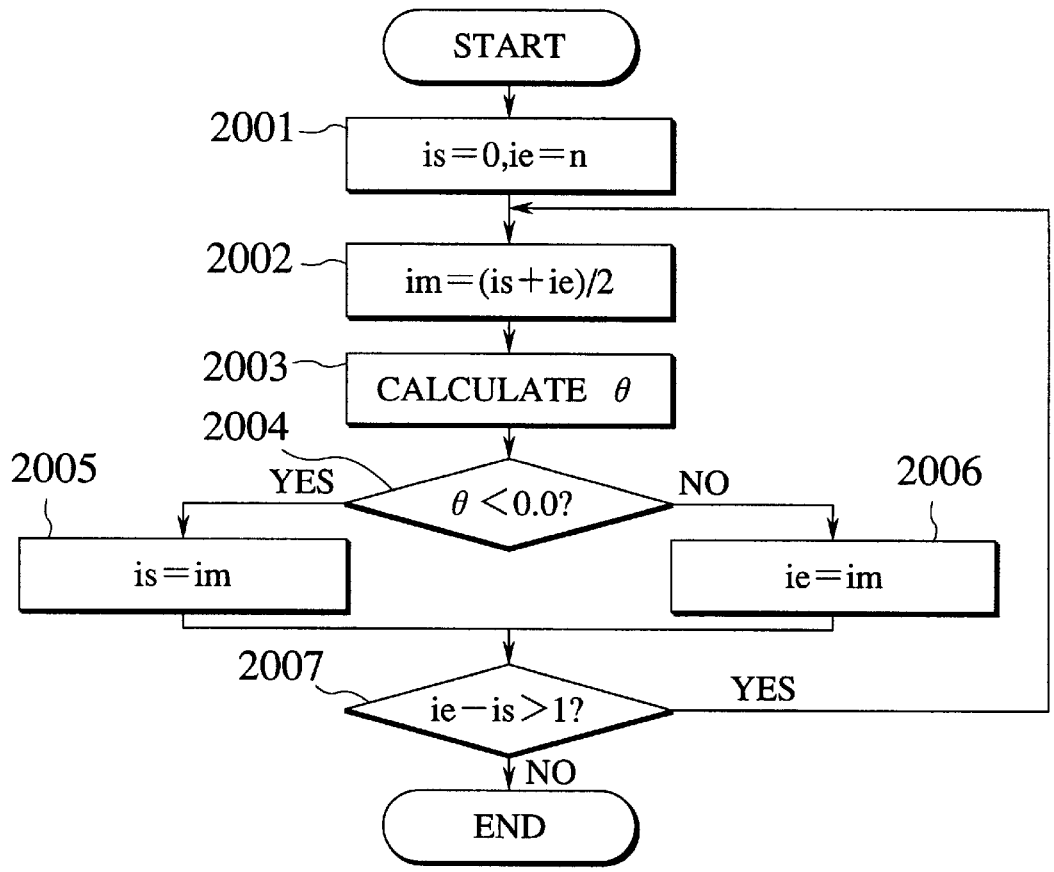
FIG. 18 is a flowchart showing the details of step 1405 of FIG. 17.

FIG. 18 shows the details of step 1405 of FIG. 17 for extracting a segment number k (corresponding to "is" in FIG. 18) from the segment list according to the bisection method. Step 2001 sets a lower limit "is" and an upper limit "ie" of a range where the bisection method is carried out to a first segment number of 0 and a last segment number of "n" contained in the segment list. Step 2002 finds an intermediate point between the lower and upper limits. Step 2003 calculates a supplement θ defined by the start and end points of an "im"th segment and the point Pi+1. Step 2004 checks to see if the supplement θ is negative. If it is negative, step 2005 updates the lower limit "is" to "im," and if not, step 2006 updates the upper limit "ie" to "im." Step 2007 checks to see if the difference between "is" and "ie" is greater than 1. If it is true, the flow returns to step 2002. Until step 2007 becomes false, steps 2002 to 2006 are repeated. If step 2007 is false, the flow ends.

Figure 19:
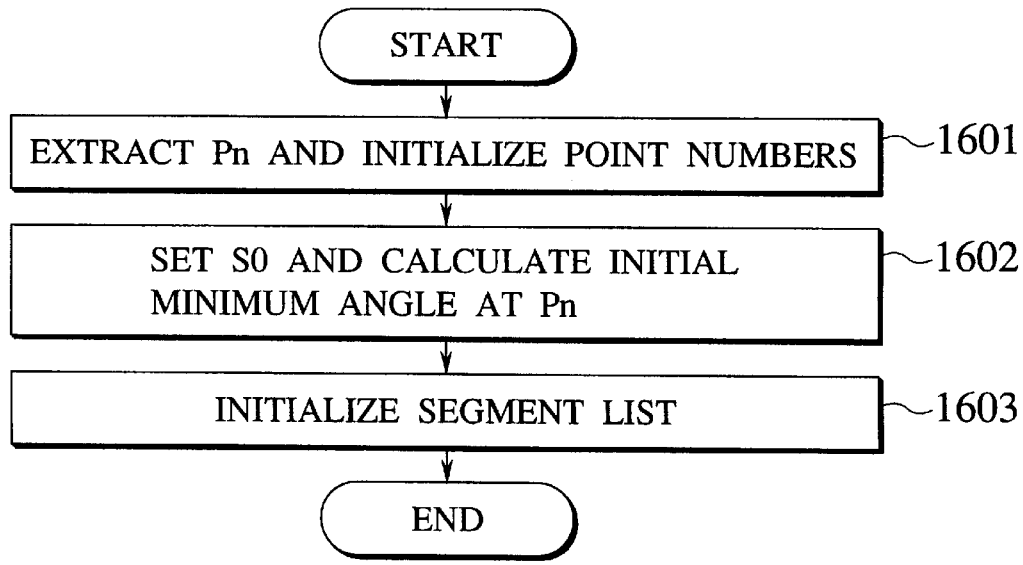
FIG. 19 is a flowchart showing the details of step 1207 of FIG. 15.

FIG. 19 shows the details of step 1207 of FIG. 15. Step 1601 extracts the terminal Pn of the string and initializes the point number "i" to "n." Step 1602 calculates a minimum angle θRn according to an initial segment S0 and the point Pn. Step 1603 saves the segment S0 in a segment list.

Figure 20:
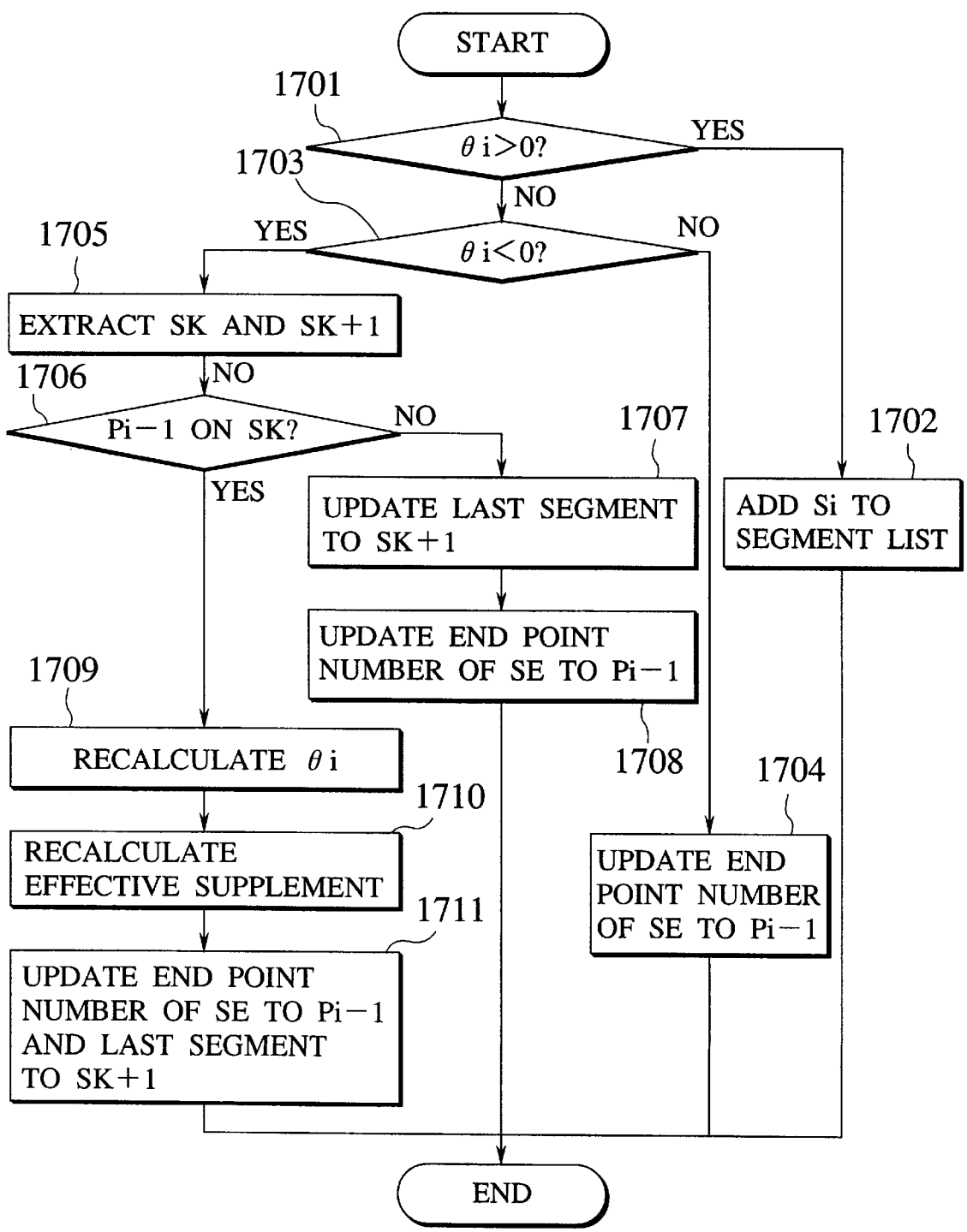
FIG. 20 is a flowchart showing the details of step 1209 of FIG. 15.

FIG. 20 shows the details of step 1209 of FIG. 15. Step 1701 checks to see if the supplement θi is positive. If it is true, the start point of the segment Si determines a minimum angle. Then, step 1702 adds the segment Si to the segment list, and the flow ends.

If step 1701 is false, step 1703 checks to see if the supplement θi is negative. If it is false, i.e., if the supplement is zero, step 1704 updates the end point number of the last segment SE in the segment list to Pn-i, and the flow ends. If step 1703 is true, step 1705 extracts a segment number "k" from the segment list according to the bisection method. Here, the segment number "k" specifies adjacent segments Sk and Sk+1 which are contained in the segment list and whose extensions define an area in which the point Pn-i is present.

Step 1706 checks to see if the point Pi-1 is on the extension of the segment Sk. If it is false, step 1707 updates the number "E" of the last segment SE in the segment list to "k+1." Step 1708 updates the end point number of the last segment SE to "Pn-i."

If step 1706 is true, step 1709 recalculates a supplement θi defined by the start point and end point of the segment Sk and the point Pn-i+1. Step 1710 recalculates an effective supplement according to a minimum angle saved for the segment Sk and the recalculated supplement θi. Step 1711 updates the number "E" of the last segment SE to "k+1," and the flow ends.

Figure 21:
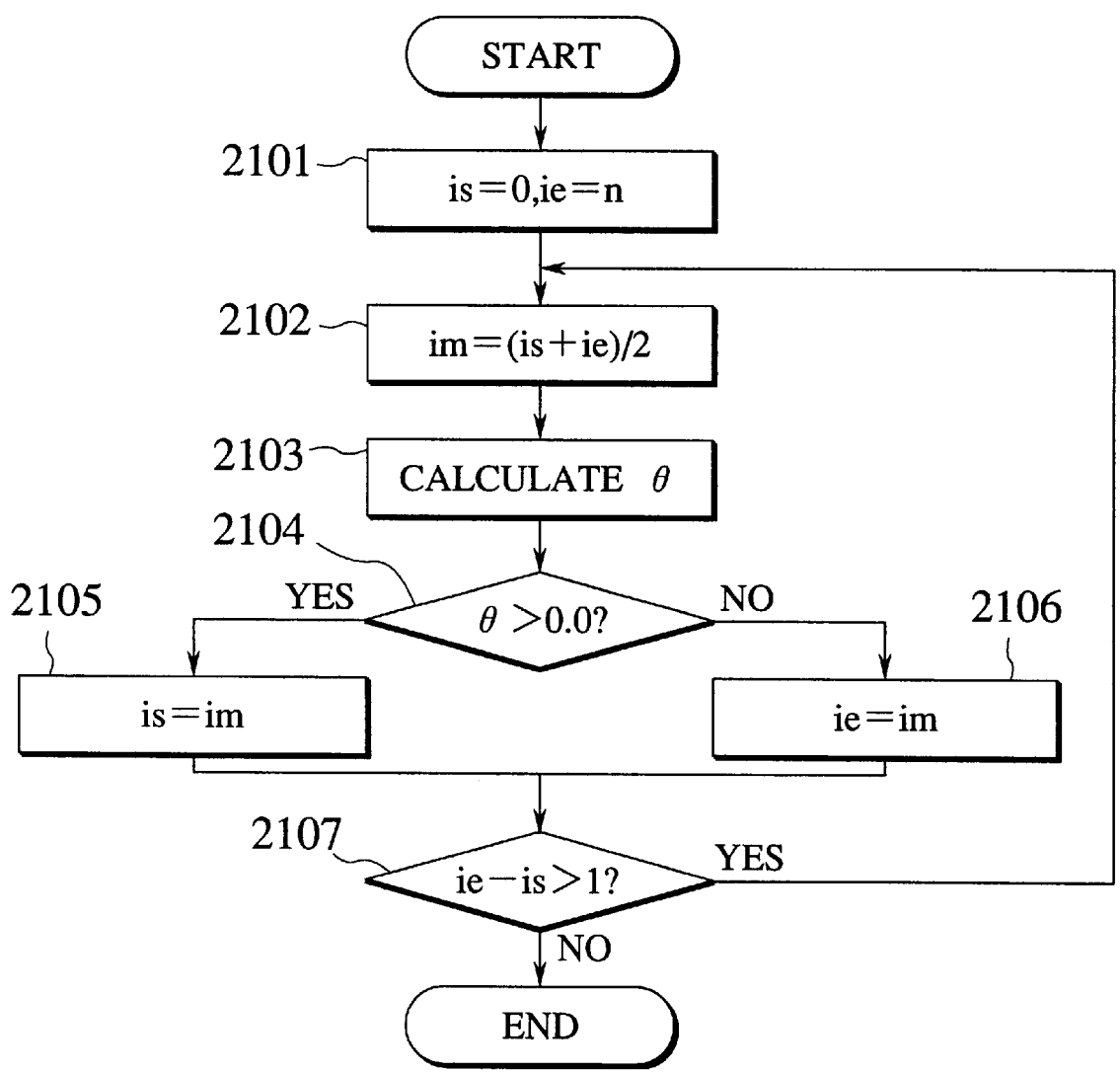
FIG. 21 is a flowchart showing the details of step 1705 of FIG. 20.

FIG. 21 shows the details of step 1705 of FIG. 20 for extracting a segment number k (corresponding to "is" in FIG. 21) from the segment list according to the bisection method. Step 2101 sets a lower limit "is" and an upper limit "ie" of a range where the bisection method is carried out to a first segment number of 0 and a last segment number of "n" contained in the segment list. Step 2102 finds an intermediate point between the lower and upper limits. Step 2103 calculates a supplement θ defined by the start and end points of an "im"th segment and the point Pi-1.

Step 2104 checks to see if the supplement θ is positive. If it is true, step 2105 updates the lower limit "is" to "im," and if not, step 2106 updates the upper limit "ie" to "im." Step 2107 checks to see if the difference between "is" and "ie" is greater than 1. If it is true, the flow returns to step 2102. Until step 2107 becomes false, steps 2102 to 2106 are repeated. If step 2107 is false, the flow ends.

Figure 5:
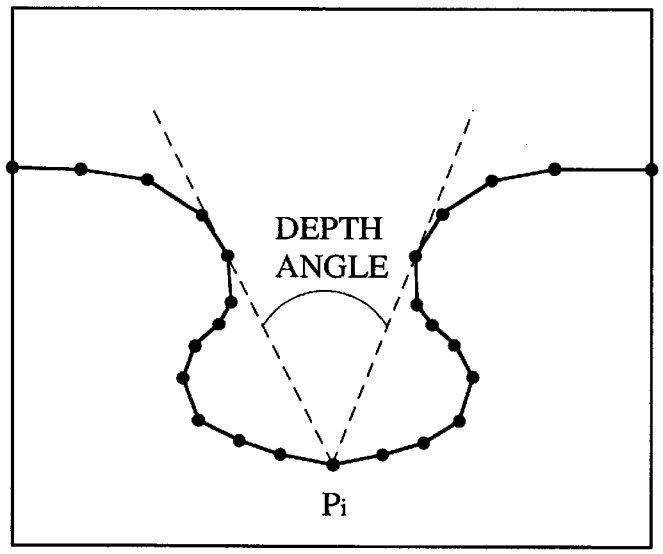
FIG. 5 explains a depth angle.
Figure 6:
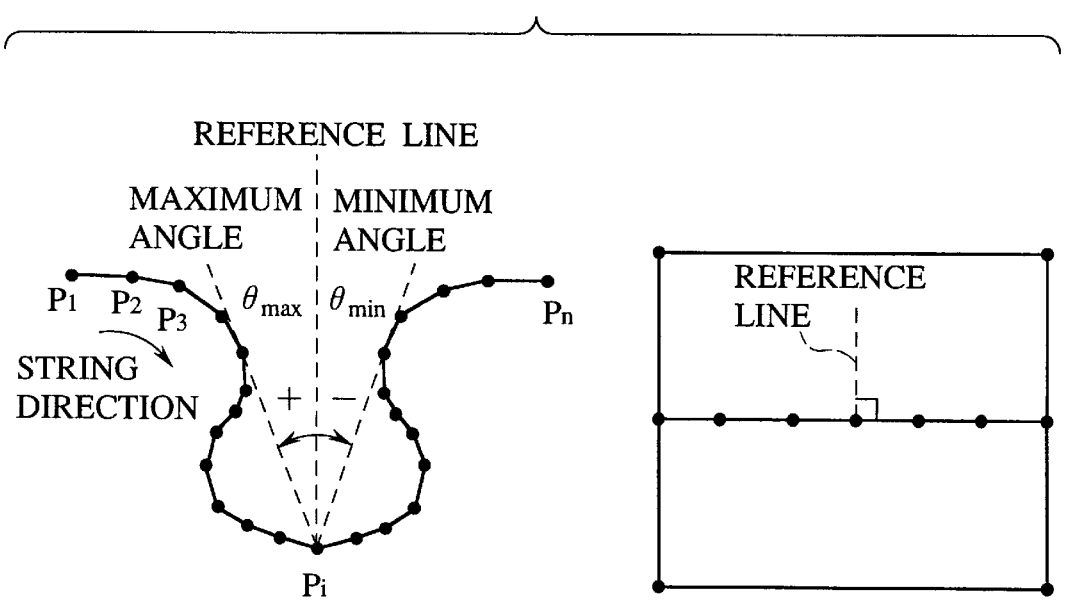
FIG. 6 explains a maximum angle and a minimum angle that constitute a depth angle.
Figure 7:
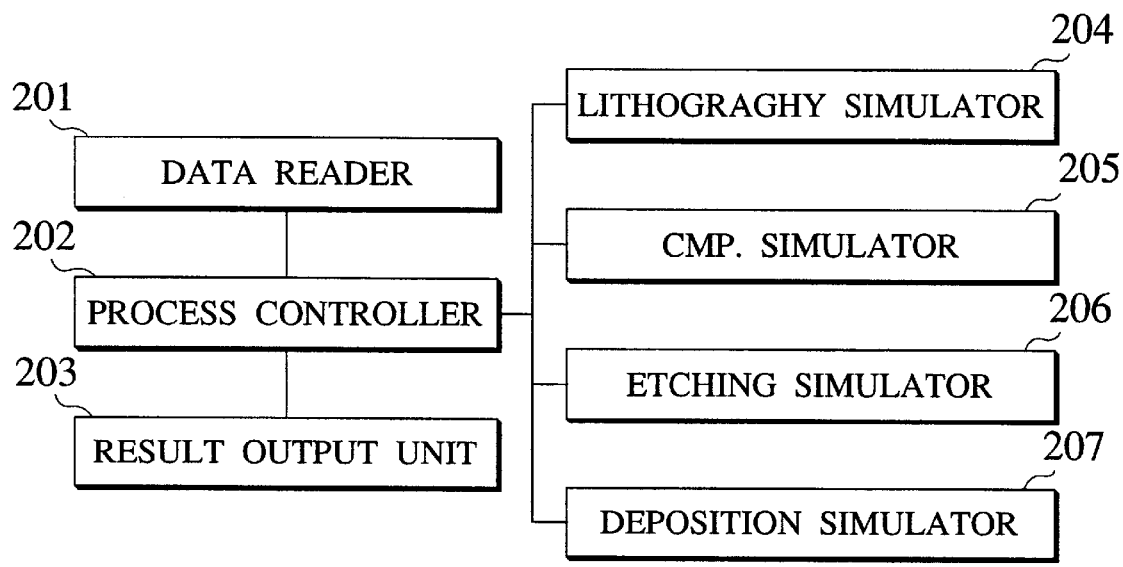
FIG. 7 is a block diagram showing a shape simulation apparatus according to a prior art.
Figure 8:
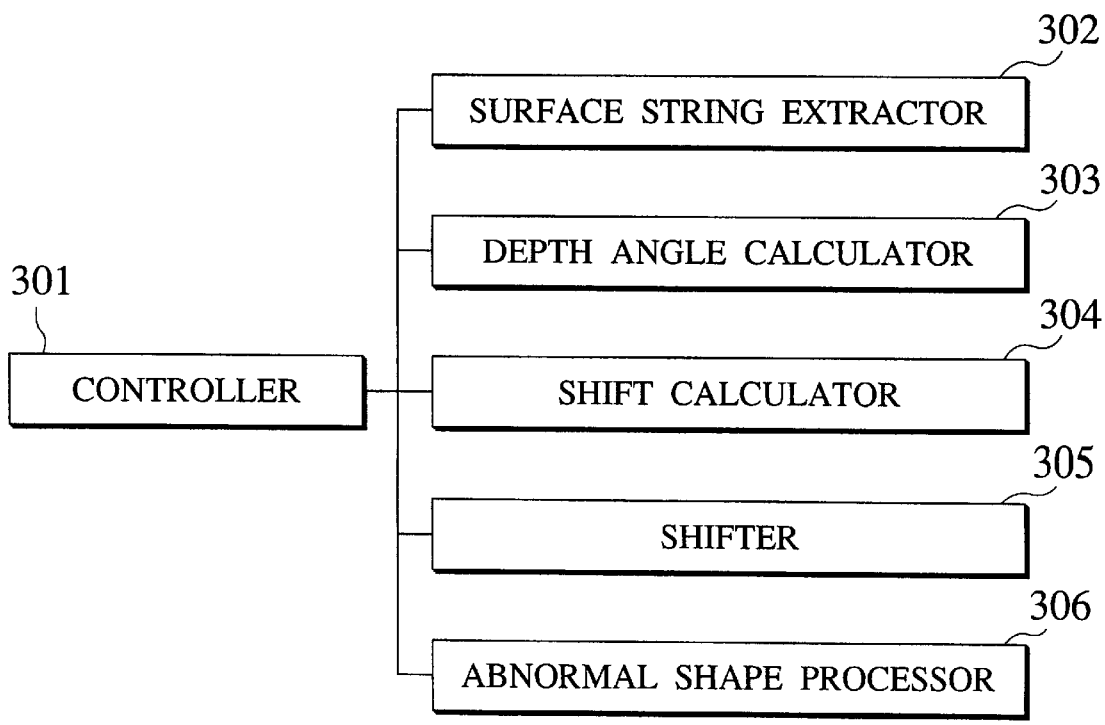
FIG. 8 is a block diagram showing the details of a deposition simulator 207 of FIG. 7.
Figure 9:
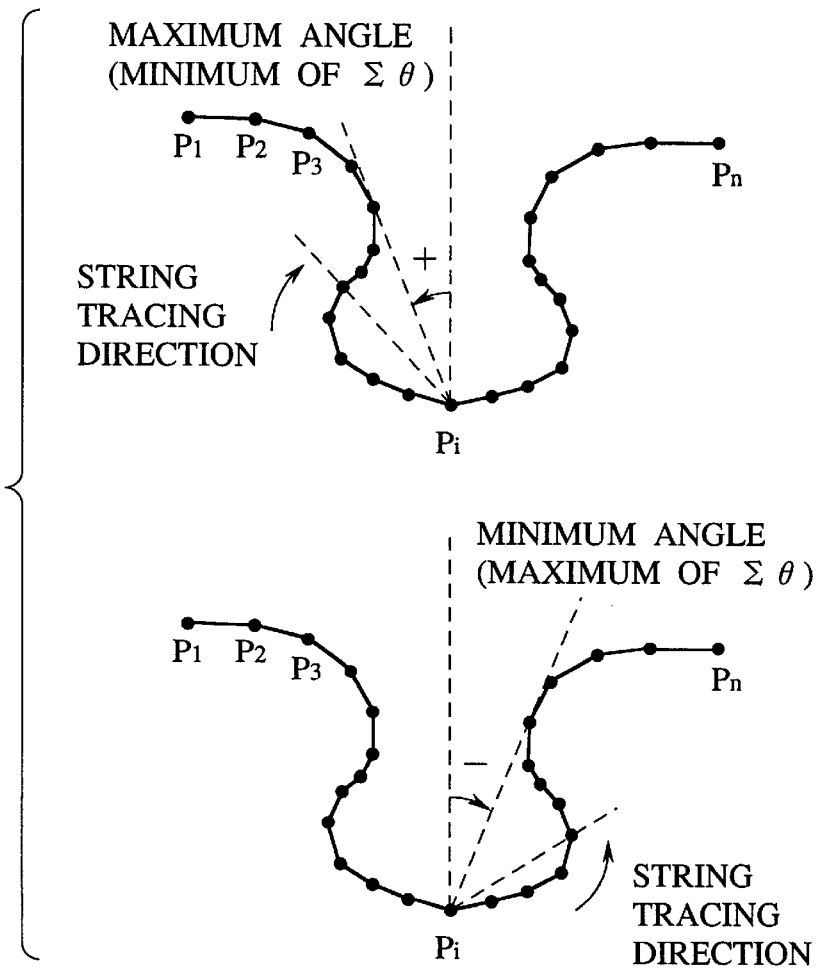
FIG. 9 explains a conventional depth angle calculation technique.
Figure 10:
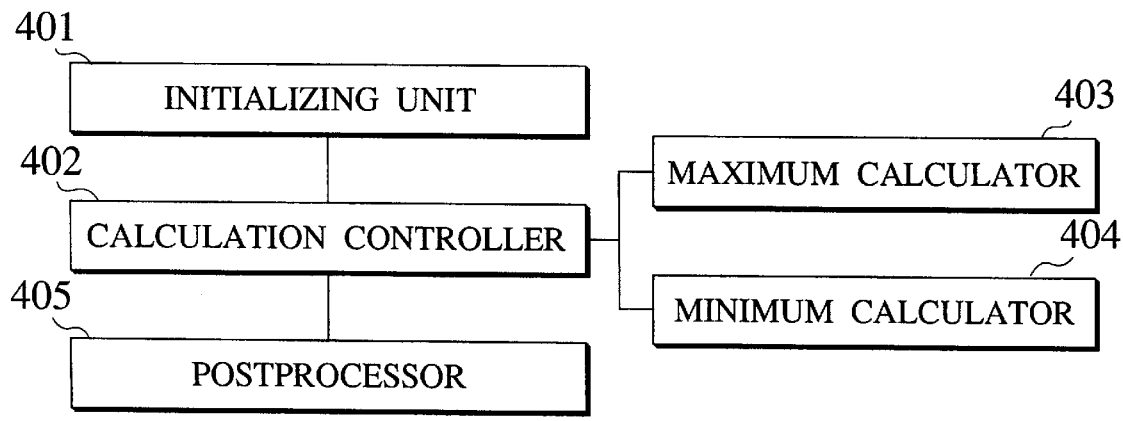
FIG. 10 is a block diagram showing the details of a depth angle calculator 303 of FIG. 8.
Figure 11:
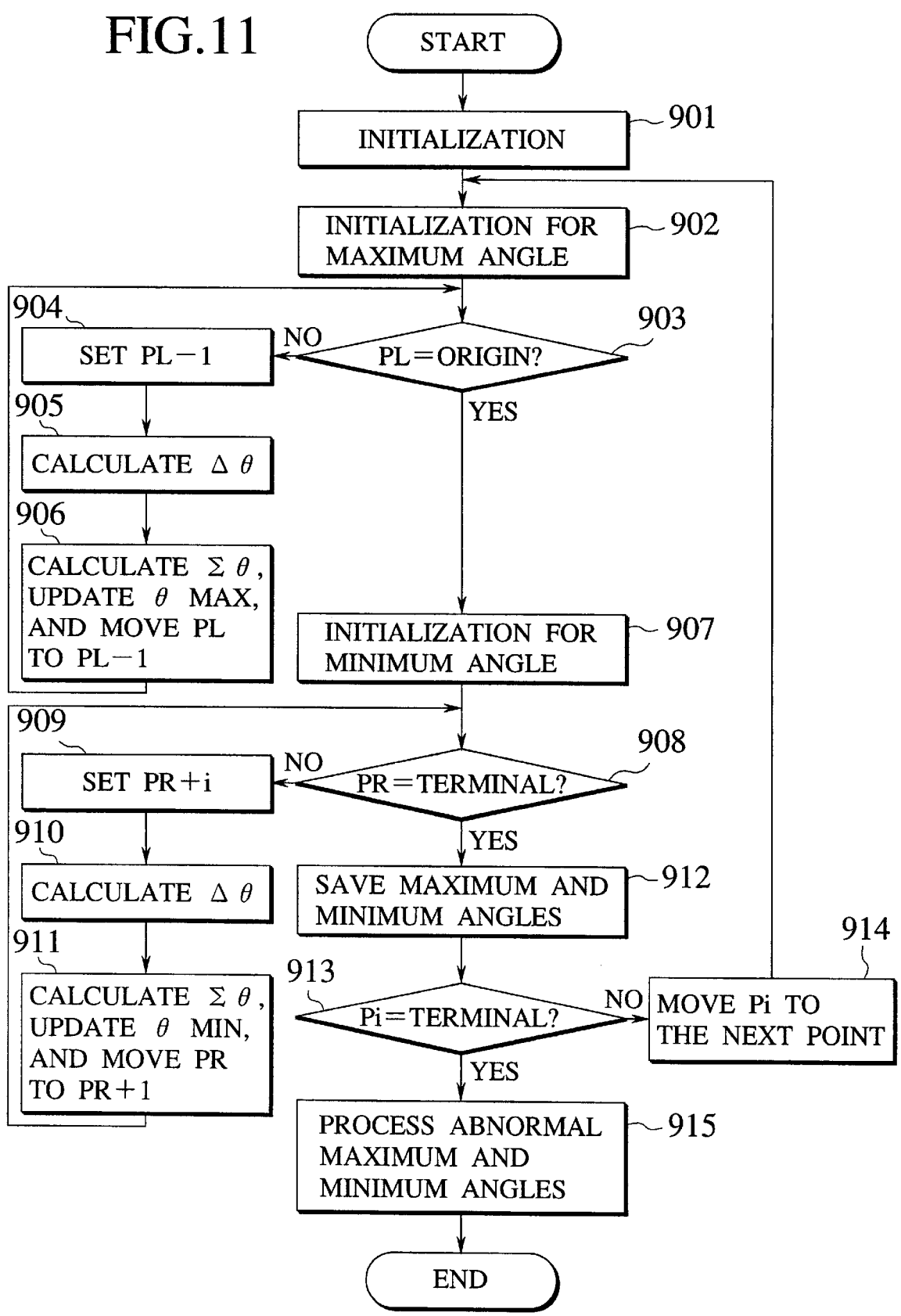
FIG. 11 is a flowchart showing the conventional depth angle calculation technique.
Figure 12:
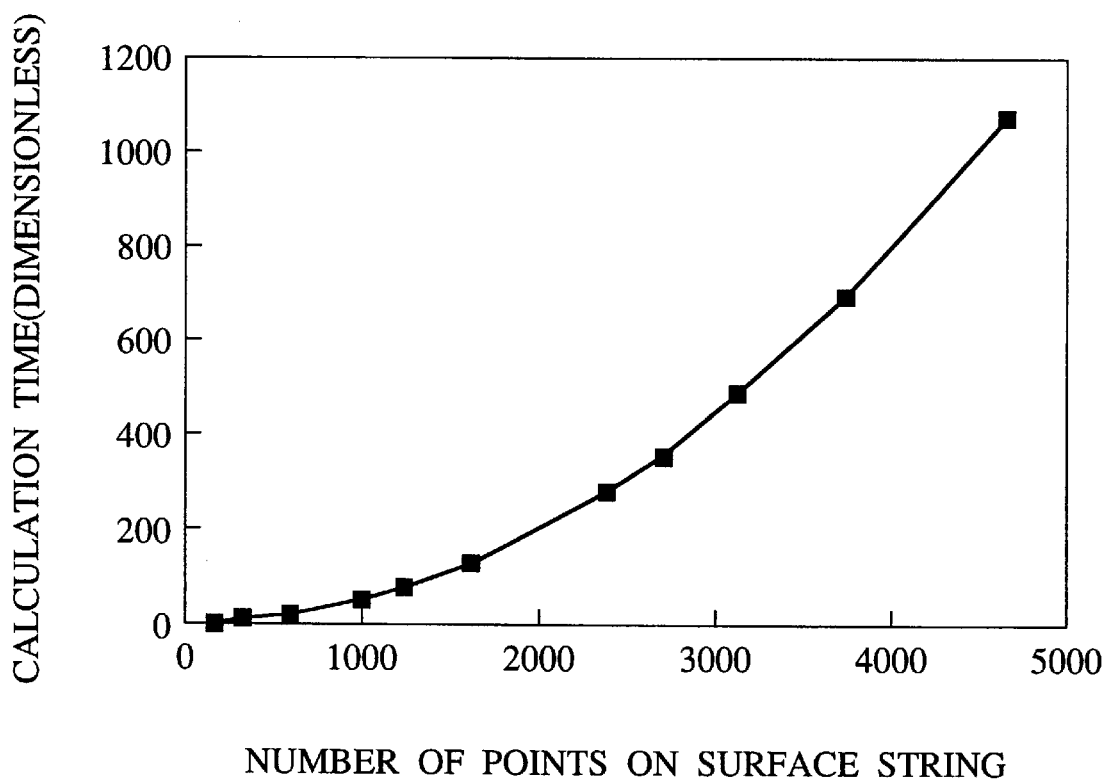
FIG. 12 is a graph showing depth angle calculation time according to the prior art.

The operation of the first embodiment, which involves the blocks and steps mentioned above, will be explained in detail. Depth angle calculations in the following explanation are based on the surface shape shown in FIG. 5 on which a deposition process simulation is carried out.

Figure 22A:
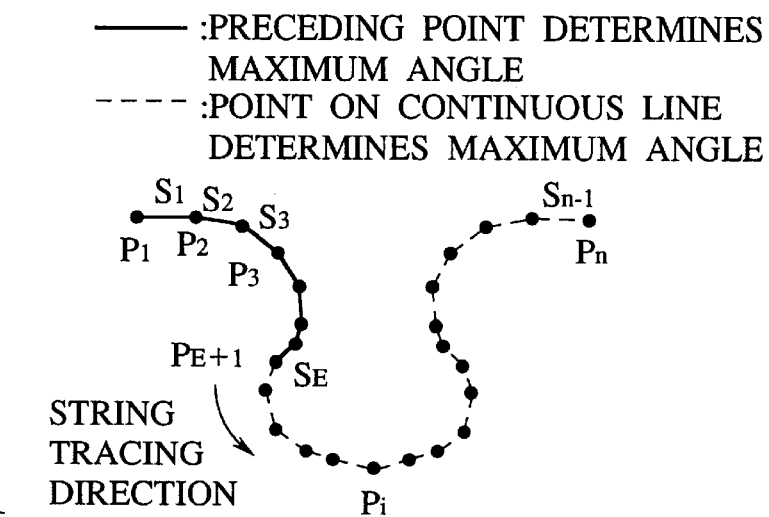
FIGS. 22A and 22B show an outline of the depth angle calculation method of the present invention.
Figure 22B:
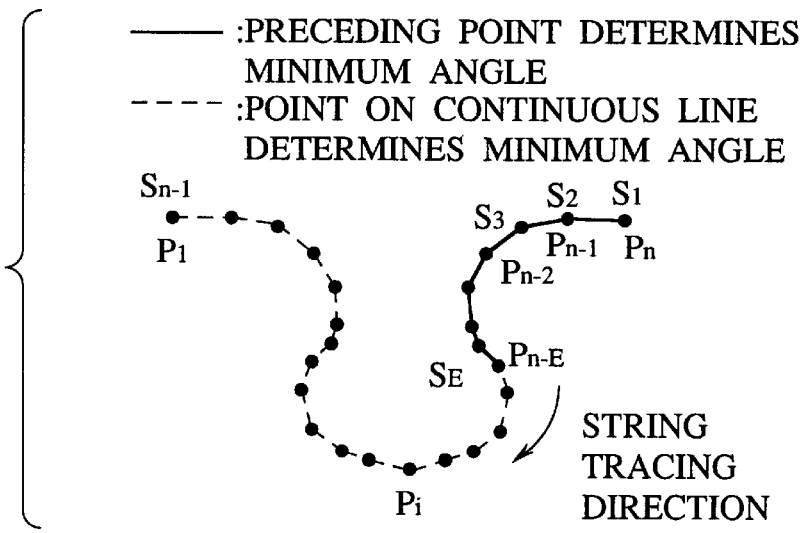
Figure 23:
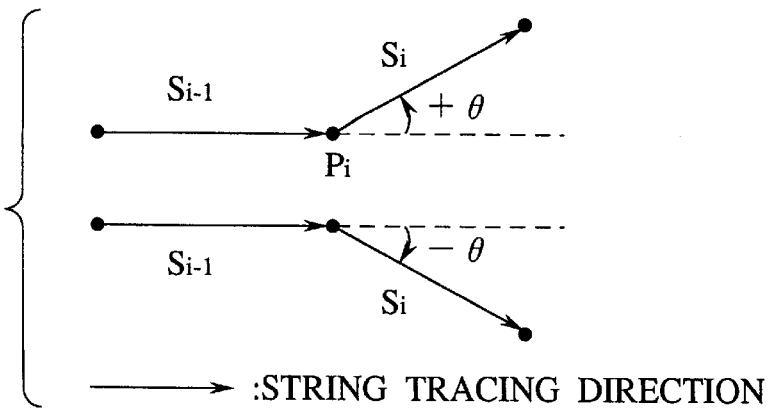
FIG. 23 explains the definition of a supplement of adjacent two segments.

FIGS. 22A and 22B show an outline of the depth angle calculation method of the first embodiment. In FIG. 22A, a surface string that represents the surface shape of FIG. 5 extends from an origin P1 to a terminal Pn. As explained above, a depth angle at a given point on the string is composed of a maximum angle and a minimum angle. To find a maximum angle at each point on the string, the string is traced from the origin P1 to the terminal Pn as shown in FIG. 22A. A maximum angle at a point that is in a range drawn with a continuous line on the string is determined by the preceding point. A maximum angle at a point that is in a range drawn with a dotted line on the string is determined by a point that is in the range drawn with the continuous line. To find a minimum angle at each point on the string, the string is traced from the terminal Pn to the origin P1 as shown in FIG. 22B. A minimum angle at a point that is in a range drawn with a continuous line on the string is determined by the preceding point. A minimum angle at a point that is in a range drawn with a dotted line on the string is determined by a point that is in the range drawn with the continuous line. In this way, maximum and minimum angles that constitute a depth angle at a given point on a given surface string are found by tracing the string from an origin to a terminal of the string when finding maximum angles and by tracing the string from the terminal to the origin when finding minimum angles. To determine whether or not the preceding point of a point Pi determines a maximum or minimum angle for the point Pi, it is sufficient to examine a supplement θ defined at the point Pi in a string tracing direction and the sign of the supplement θ that is positive in a counterclockwise direction (the sign of an angle is positive in the counterclockwise direction in this specification). FIG. 23 explains the definition of a supplement of adjacent two segments whose node Pi is a point where a maximum or minimum angle is going to be found.

Figure 24:
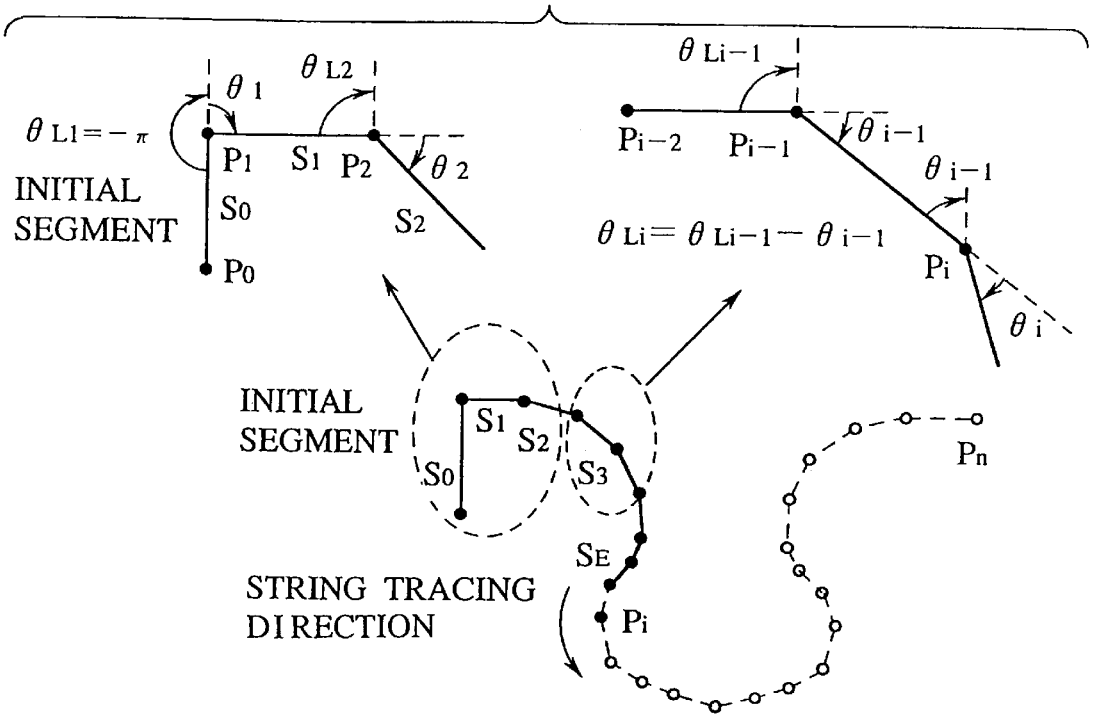
FIG. 24 explains a method of processing a point whose maximum angle is determined by the preceding point.

Based on the facts mentioned above, the first embodiment traces a given string from the origin to the terminal thereof as shown in FIG. 24. If a supplement of adjacent two segments whose node is a point Pi is negative, the preceding point of the point Pi determines a maximum angle for the point Pi. Namely, the maximum angle for the point Pi is calculable according to the supplement and a maximum angle already found at the preceding point. At this time, the segment whose start point is the point Pi is stored in a segment list. It is impossible to find a supplement if the point Pi is the origin P1 of the string. In this case, a point P0 on an optional line that passes through the origin P1 is set to define an initial segment. In the example of FIG. 24, the initial segment is on a reference line passing through the origin P1. FIG. 24 explains processes to determine a maximum angle at a given point according to the preceding point.

According to the first embodiment, the number of operations to be carried out for finding maximum angles at points where supplements of adjacent segments are each negative is O(n1) where "n1" is the number of such points.

Figure 25:
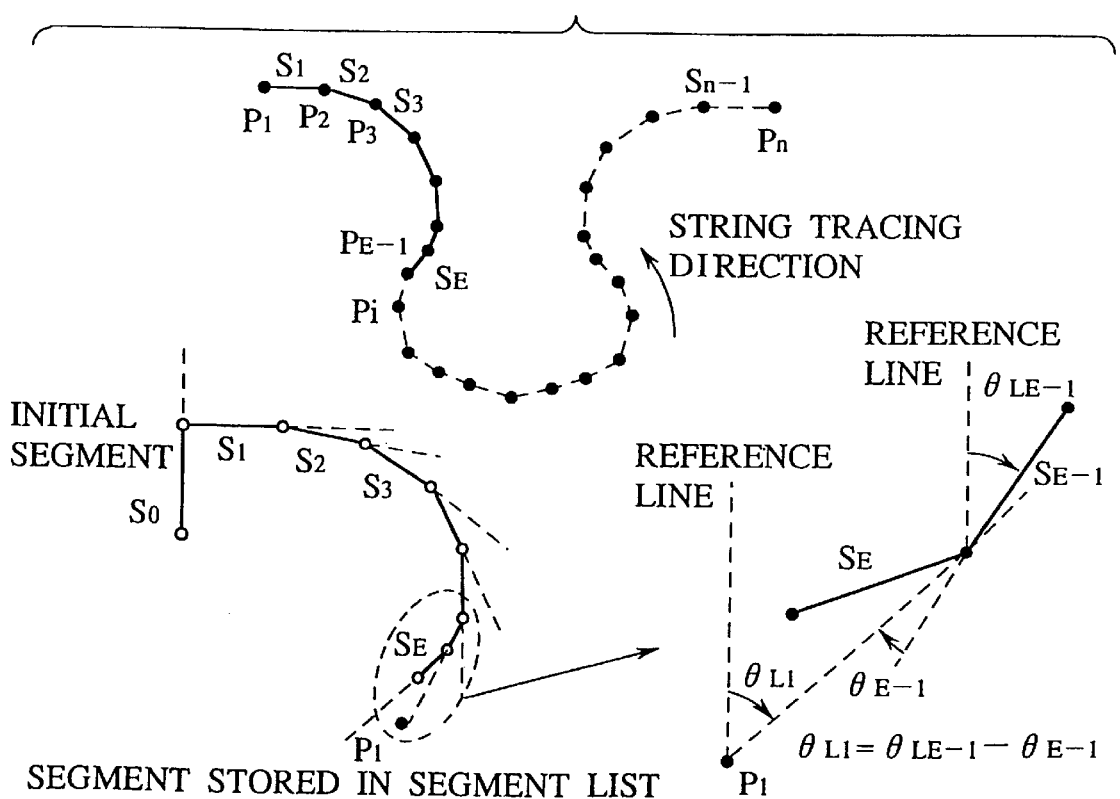
FIG. 25 explains a recalculation of a supplement according to the segment list, to find a maximum angle.

On the other hand, if a supplement of adjacent two segments whose node is a depth-angle-calculation point Pi is positive, two root segments are found in the segment list according to the bisection method as shown in FIG. 25. The root segments are segments whose extensions in the string tracing direction define an area in which the point Pi is present. This technique is based on the fact that a node between such root segments determines a maximum angle for the point Pi. Thereafter, a supplement θE−1 defined by the point Pi and the segment whose end point is the node that determines the maximum angle of the point Pi is calculated, and the maximum angle at the point Pi is calculated according to the supplement θE−1 and a maximum angle already known at the node as shown in FIG. 25.

According to the first embodiment, the number of operations to be carried out for finding maximum angles at points where supplements of adjacent segments are each positive is O(n2·log(n1)) where "n2" is the number of such points.

Figure 26:
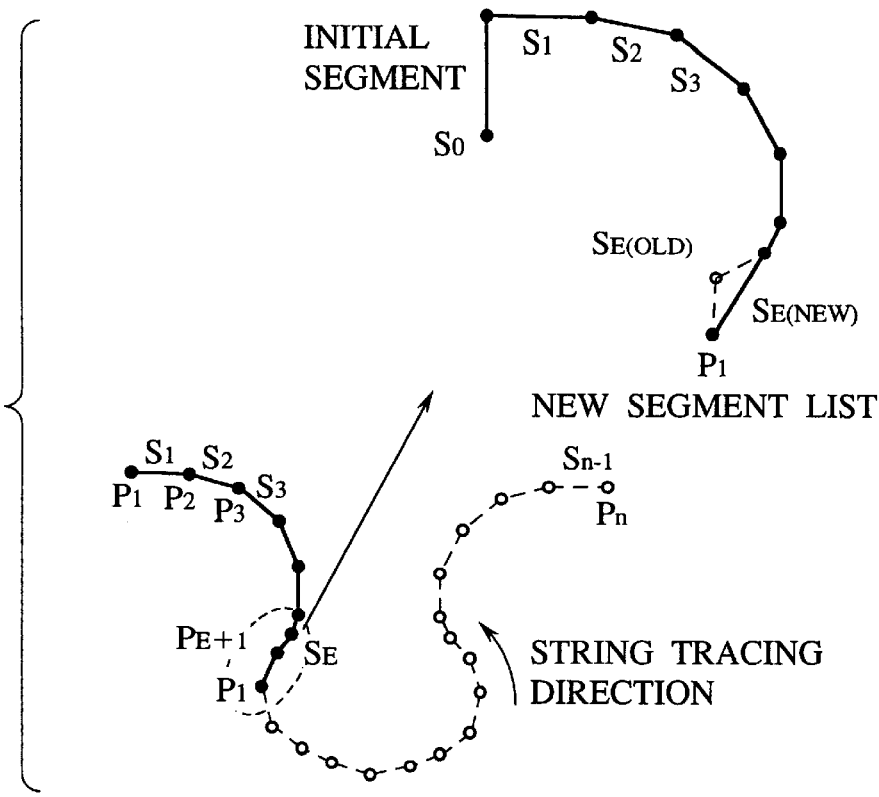
FIG. 26 explains a method of updating the segment list to find a maximum angle.

Thereafter, the first embodiment updates the end point of the segment whose start point is the node that determines the maximum angle of the point Pi to the point Pi, and stores the segment as the last segment in the segment list as shown in FIG. 26. As a result, segments stored in the segment list and used to find maximum angles will be in a range drawn with a continuous line in the lower part of FIG. 27.

Figure 27:
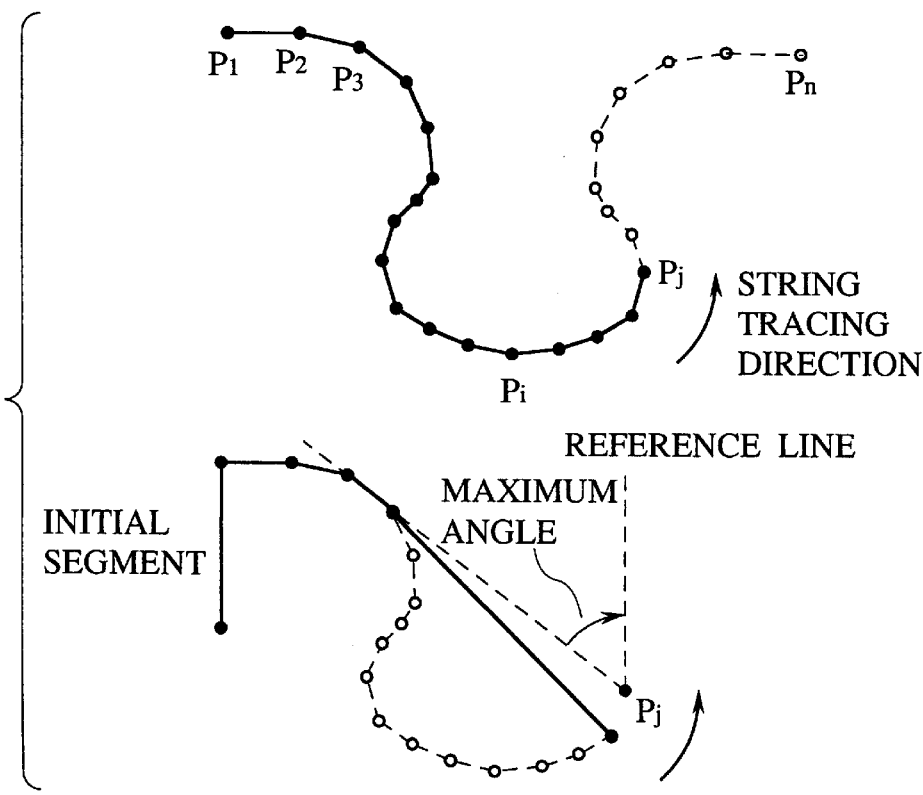
FIG. 27 shows the relationship between a string and segments used to update the segment list to find a maximum angle.

FIG. 26 explains the technique of updating the segment list during the maximum angle finding stage, and FIG. 27 explains the relationship between the string and segments updated in the segment list during the maximum angle finding stage.

Figure 28:
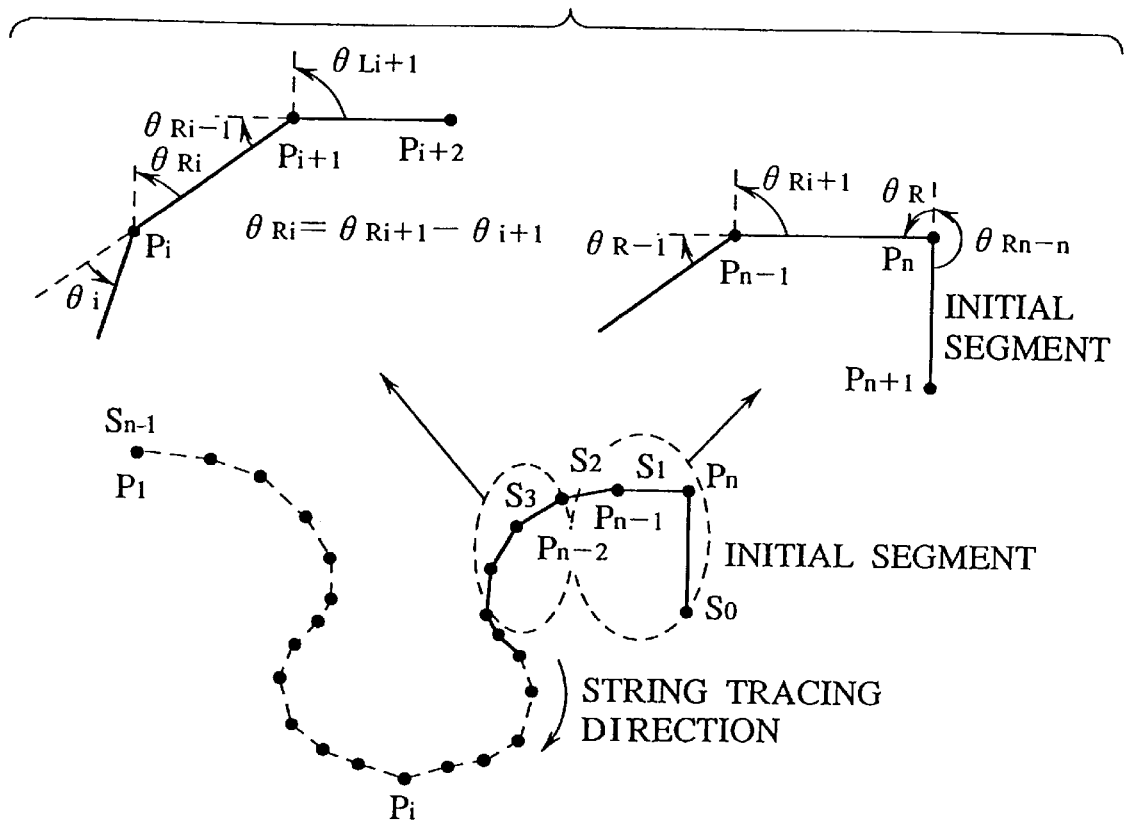
FIG. 28 shows a method of finding a minimum angle.

As explained above, the first embodiment is capable of minimizing the number of segments stored in the segment list based on which the bisection method is carried out. As a result, the number of operations to be carried out to find maximum angles will be O(n2·log(m)) where "m" is an average of segments stored in the segment list for each search (m<n1). Minimum angles each constitutes a part of a depth angle will be calculated according to the technique of FIG. 24 and definitions and calculations shown in FIG. 28. The number of operations for calculating minimum angles is the same as that for calculating maximum angles. FIG. 28 shows the technique of finding minimum angles.

Figure 1:
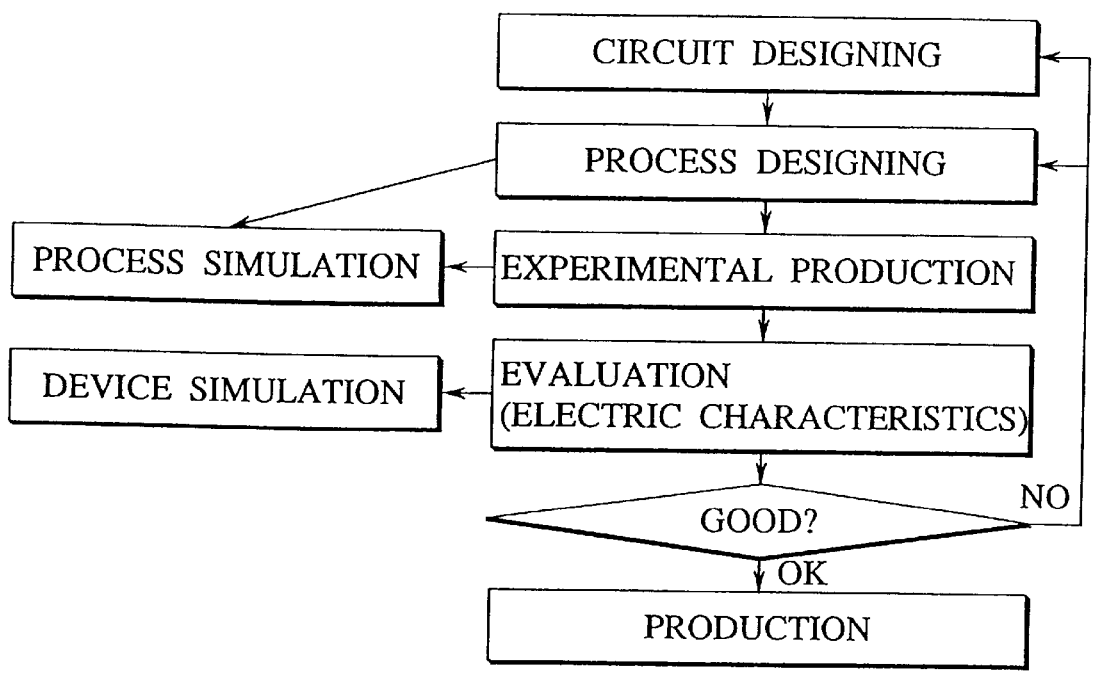
FIG. 1 is a flowchart showing processes for manufacturing a semiconductor device.
Figure 2:
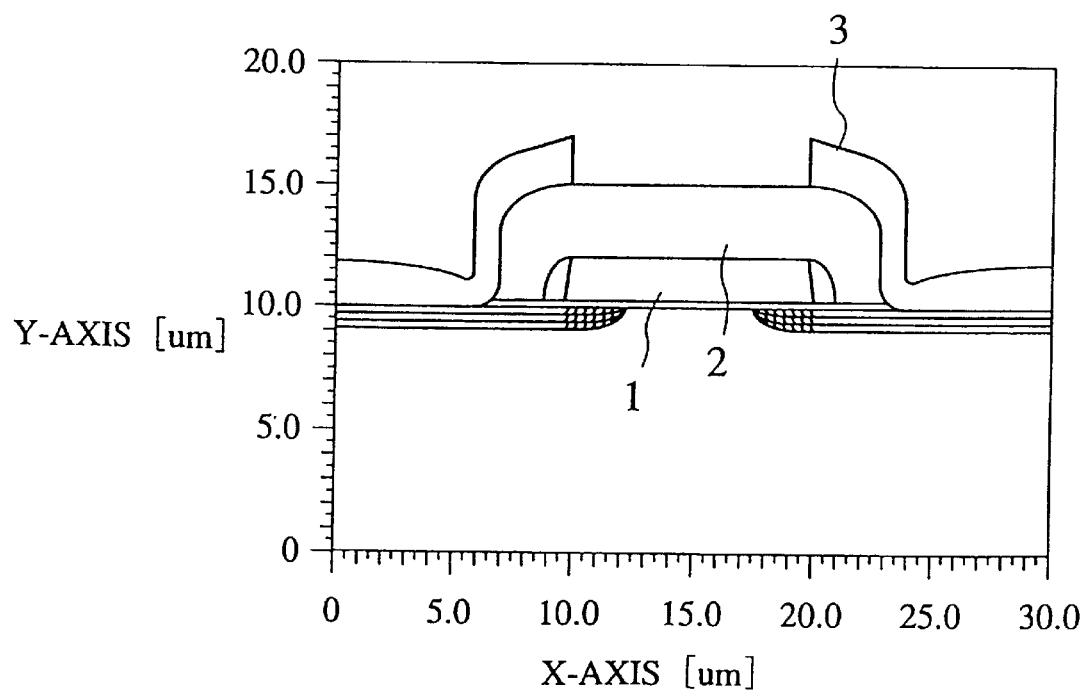
FIG. 2 shows a result of a simulation of a MOSFET manufacturing process.
Figure 3:
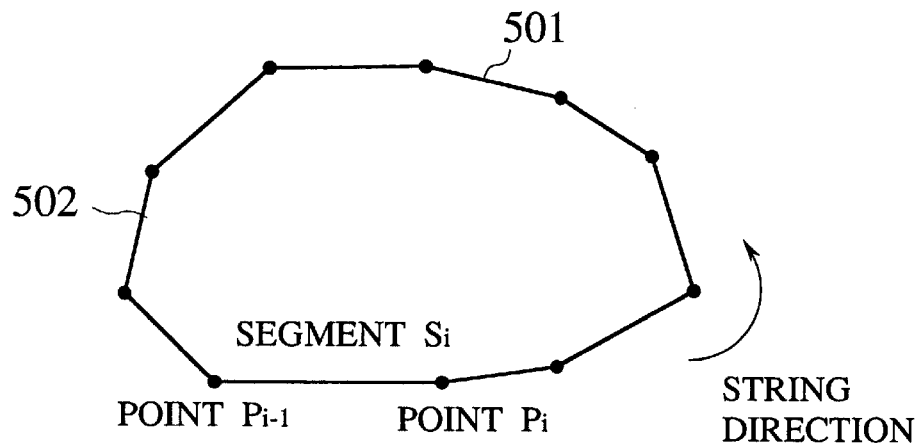
FIG. 3 explains a string model.
Figure 4A:
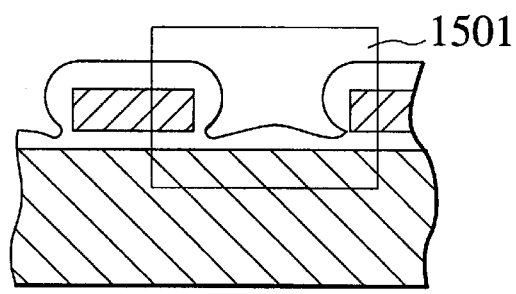
FIG. 4A is a cross sectional view showing a semiconductor element.
Figure 4B:
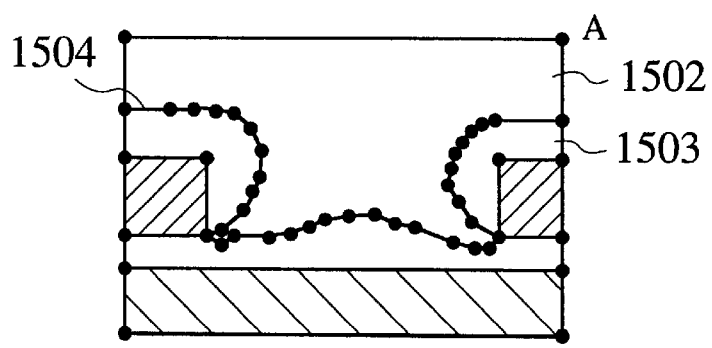
FIG. 4B is a sectional view showing a string model representing part of the element of FIG. 4A.
Figure 4C:
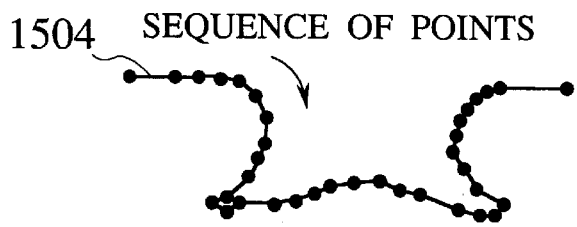
FIG. 4C is a string representing a boundary between a vacuum region and a material region of the model of FIG. 4B.
Figure 29:
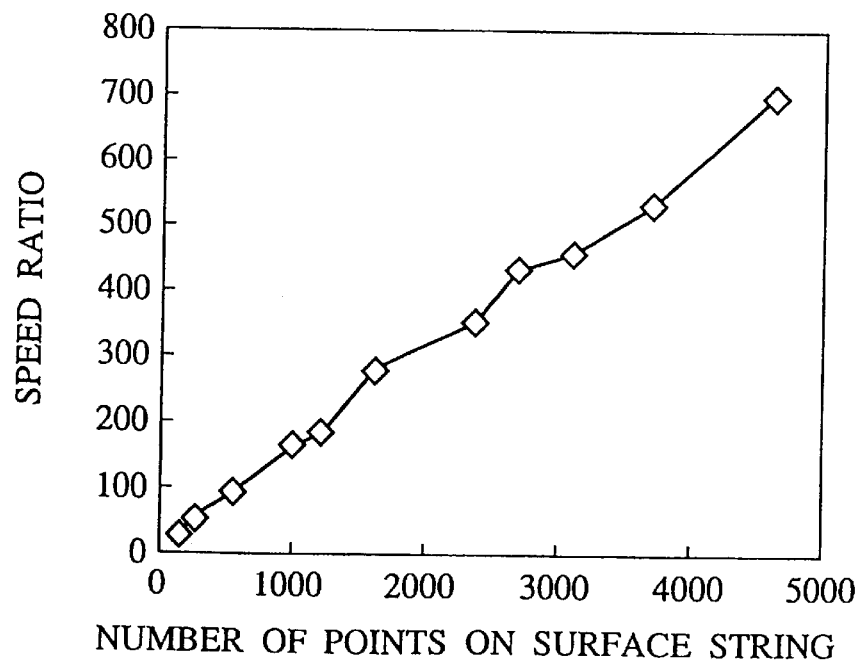
FIG. 29 is a graph showing calculation speed ratios according to the present invention.

According to the first embodiment, the number of operations to be carried out to find maximum and minimum angles on a surface string is O(n) when the string is flat and O(n·log(m)) when the string is curved. Consequently, the ratio of the first embodiment to the prior art in terms of depth angle calculation time changes substantially linearly. FIG. 29 is a graph showing comparison between the first embodiment and the prior art in calculating depth angles for simulating a deposition process carried out on the surface shape of FIG. 2. An ordinate of the graph represents a speed ratio based on the ratio of calculation time between the prior art and the first embodiment, and an abscissa thereof indicates the number of points to calculate depth angles on the surface string. The speed ratio substantially linearly changes. When the number of points on the string is 500, the first embodiment is 100 times speedier than the prior art, and when the number of points is 1000, the first embodiment is 200 times speedier than the prior art.

The second embodiment of the present invention will be explained with reference to FIGS. 30 to 34.

The first embodiment is unable to calculate depth angles on such a string shown in FIG. 30A. When tracing the string from the origin to the terminal thereof, a maximum angle at a point Pj (FIG. 30B) will not correctly be calculated. This is because the point Pj will be out of ranges defined by segments stored in a segment list, as shown in FIG. 30C. The second embodiment is capable of coping with this situation.

A simulation method and a simulation apparatus according to the second embodiment will be explained. The second embodiment is based on the first embodiment, and therefore, only the difference between them will be explained.

FIG. 31 is a block diagram showing a simulation system according to the second embodiment. In addition to the system of FIG. 14, the system of FIG. 31 has a conventional maximum angle calculator 2205 and a conventional minimum angle calculator 2209. The calculator 2205 calculates, according to the conventional maximum angle calculation technique, maximum angles in a partial range of a surface string where the first embodiment is inapplicable. The calculator 2209 calculates, according to the conventional minimum angle calculation technique, minimum angles in a partial range of a surface string where the first embodiment is inapplicable.

Figure 32:
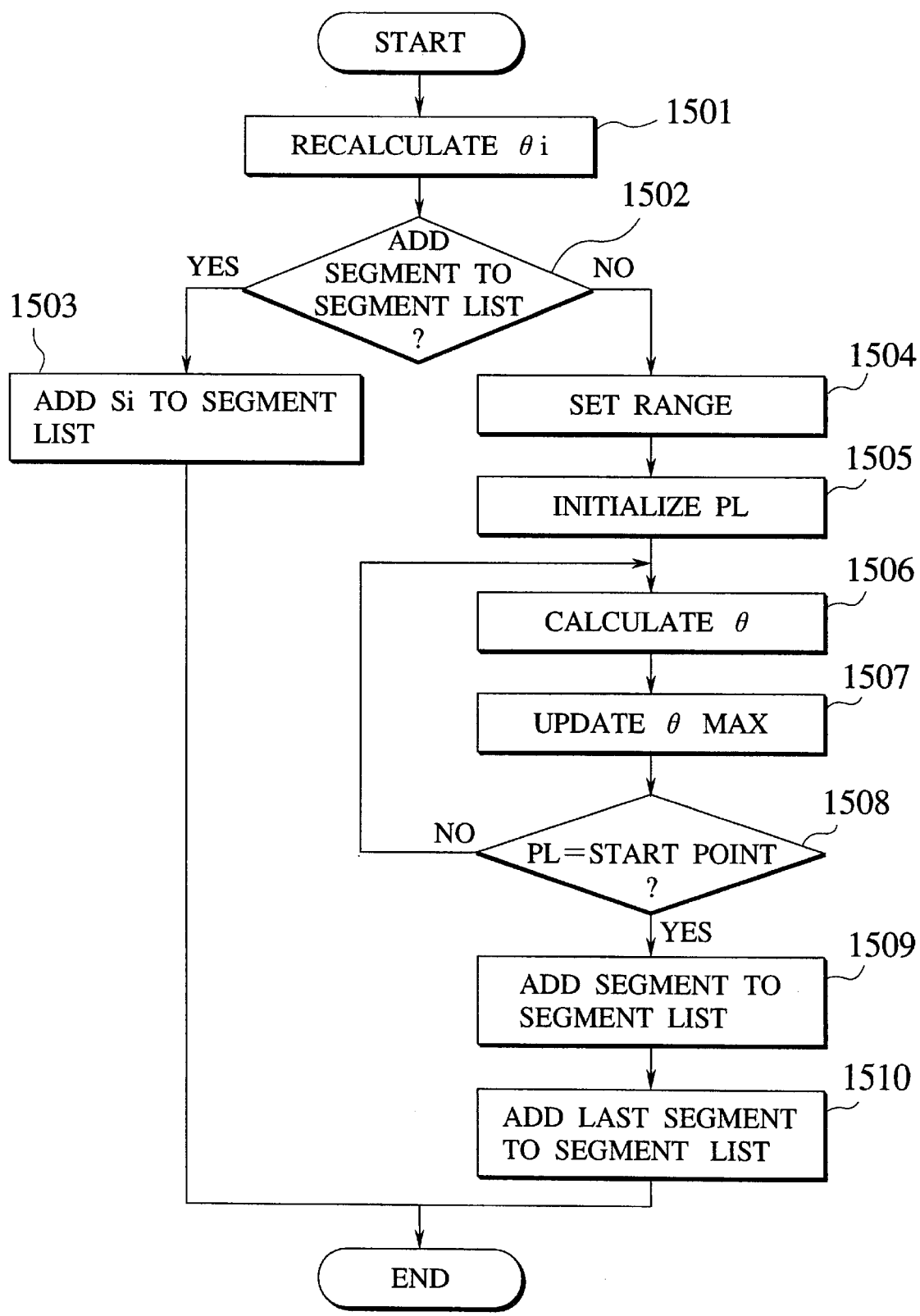
FIG. 32 is a flowchart showing a maximum angle calculation part of a depth angle calculation method according to the second embodiment.
Figure 33:
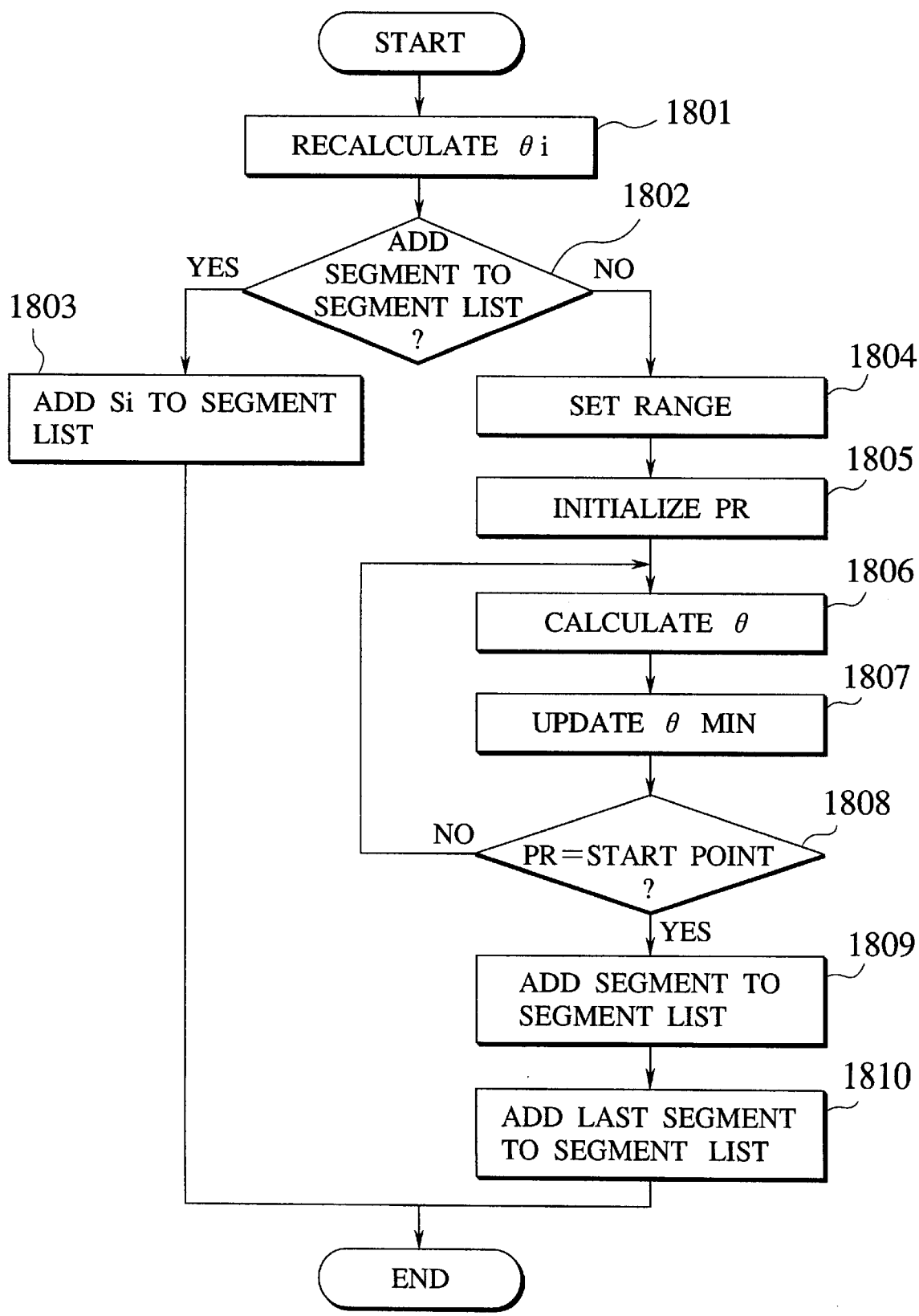
FIG. 33 is a flowchart showing a minimum angle calculation part of the second embodiment.

FIGS. 32 and 33 are flowcharts specific to the second embodiment. The flowchart of FIG. 32 replaces step 1402 of FIG. 17 of the first embodiment, and the flowchart of FIG. 33 replaces step 1702 of FIG. 20 of the first embodiment.

In FIG. 32, step 1501 recalculates the supplement θi according to the points Pi−1, Pi, and Pi+1. Step 1502 checks to see if the recalculated supplement θi is negative and determines whether or not the segment Si must be added to the segment list. If it is true, step 1503 adds the segment Si to the segment list, and the flow ends. If step 1502 is false, step 1504 sets a range from the point Pi−1 to the start point of the first segment stored in the segment list so that the conventional maximum angle calculation technique is applied to the range. Step 1505 initializes the search point PL to the point Pi−1. Steps 1506 to 1508 carry out the conventional technique. Namely, step 1506 calculates an angle θ defined by a segment between the points PL and Pc and a reference line, step 1507 compares the angle θ with a minimum value and updates the maximum angle θmax if necessary, and step 1508 checks to see if the point PL has reached the start point. Step 1509 adds segments in a range from the "SE−1"th segment to a string whose end point is the point found in the above steps, to the segment list. Step 1510 adds a segment whose start point is the maximum angle determining point and whose end point is the point Pi+1 to the last of the segment list.

In FIG. 33, step 1801 recalculates the supplement θi according to the points Pn−i+2, Pn−i+1, and Pi−n. Step 1802 checks to see if the recalculated supplement θi is positive and determines whether or not the segment Si must be added to the segment list. If step 1802 is true, step 1803 adds the segment Si to the segment list, and the flow ends.

If step 1802 is false, step 1804 sets a range from the point Pn−i+1 to the start point of the first segment in the segment list where the conventional minimum angle calculation method is applied. Step 1805 initializes the search point PR to the point Pn−i+1. Steps 1806 to 1808 carry out the conventional technique. Namely, step 1806 calculates an angle θ defined by a segment between the points PR and Pc and a reference line, step 1807 compares the angle θwith a maximum value and updates the minimum angle θmin if necessary, and step 1808 checks to see if the point PR has reached the start point. Step 1809 adds segments in a range from the "SE−1"th segment to a segment whose end point is the point found in the above steps, to the segment list. Step 1810 adds a segment whose start point is the point that provides the minimum angle and whose end point is the point Pn−i to the last of the segment list. Then, flow ends.

The operation of the second embodiment will be explained in detail.

Figure 34:
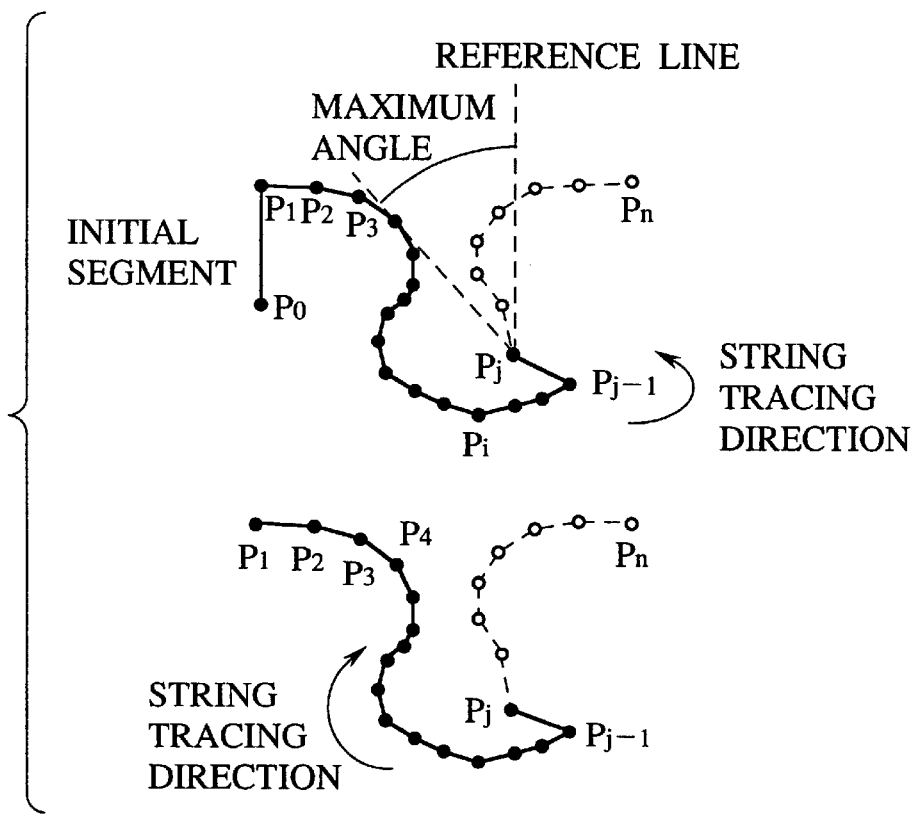
FIG. 34 explains the depth angle calculation method according to the second embodiment.

In FIG. 34, a given string is traced from the origin to the terminal thereof, to find a maximum angle at each point on the string. A point Pj is out of areas defined by segments stored in a segment list. In this case, there is a fact that a point that determines a maximum angle for the point Pj is present in a range drawn with a continuous line ranging from the start point of the first segment in the segment list to the preceding point of the point Pj.

Accordingly, if the first embodiment is unable to correctly find a depth angle at a given point, the second embodiment examines points in the range of the start point of the first segment in the segment list to the preceding point of the given point, to find a point that determines a maximum angle for the given point. In this way, the second embodiment is capable of correctly finding a depth angle at any point where the first embodiment is unable to find the depth angle.

When the second embodiment uses the conventional technique to find depth angles, the number of operations to find depth angles is $O(n \cdot \log(m) + nb \cdot np)$ where "nb" is the number of points between the start point of the first segment in a segment list and the preceding point of a target point and "np" is the number of points to which such conventional technique must be applied. Shapes that are usually handled by shape simulations satisfy "nb<<n" and "np<<n," and therefore, the number of operations to be carried out to find depth angles according to the second embodiment is substantially $O(n \cdot \log(m))$.

Any string that does not satisfy the conditions of "nb<<n" and "np<<n" needs $O(n^2)$ operations to calculate depth angles according to the second embodiment. In this case, the second embodiment may not provide a practical advantage. In this case, the bisection method of the first embodiment will be applicable to make the number of operations $O(n \cdot \log(m) + np \cdot \log(nb))$. Namely, the number of operations to be carried out to find depth angles will substantially be $O(n \cdot \log(m))$.

In summary, the present invention suppresses a parabolic increase in depth angle calculation time to a linear increase at most with respect to an increase in the number of points to calculate depth angles on a surface string. The present invention, therefore, is advantageous in increasing the number of depth angle calculation points on a string to improve the accuracy of a shape simulation carried out based on the string. The present invention is also advantageous in increasing the number of intervals of simulations carried out on a physical model, to improve the correctness of the simulations. The present invention is capable of speedily and accurately simulate, for example, a deposition process that deposits metal such as aluminum on a substrate in a vacuum with the use of physical adsorption.

Various modifications will become possible for those skilled in the art after receiving the teachings of the present disclosure without departing from the scope thereof.

What is claimed is:

1. A method of simulating a two-dimensional shape of a processing surface for a physical process that sends particles directly to the processing surface, comprising the steps of:
   expressing a closed area containing the processing surface with strings composed of points and segments that extend between the points and extracting, from the strings, a surface string that represents the processing surface and extends between an origin and a terminal;
   calculating depth angles at each of the points on the surface string, each of the depth angles being an angle in which particles fly toward the corresponding point; and
   using the depth angles to simulate changes to occur in the two-dimensional shape of the processing surface due to the physical process,
   wherein the calculating depth angles step comprises the steps of:
      tracing a string that represents the surface of a material from an origin to a terminal of the string;
      calculating a depth angle at each point on the string;
      if the depth angle at a target point on the string is determined by the preceding point of the string, then; calculating the depth angle at the target point; and storing a segment between the target point and the preceding point to a segment list;
      if the depth angle at the target point on the string is not determined by the preceding point of the string, then; finding a point that determines the depth angle for the target point in the segment list; and removing redundant segments from the segment list.

2. The method of claim 1, wherein the physical process is a deposition process that deposits metal on the processing surface in a vacuum with the use of physical adsorption.

3. The method of claim 1, wherein the physical process is a sputtering process that sputters metal on the processing surface.

4. The method of claim 3, wherein the metal is refractory metal.

5. The method of claim 1, wherein the physical process is a reactive ion etching process.

6. The method of claim 1, wherein the calculating depth angles step includes the steps of:
   tracing points on the surface string from a given point toward the origin, to find a minimum of angles defined by the traced points and a reference line extending from the given point, and determining a maximum angle according to the minimum, the maximum angle constituting part of a depth angle at the given point;

tracing points on the surface string from the given point toward the terminal, to find a maximum of angles defined by the traced points and the reference line, and determining a minimum angle according to the maximum, the minimum angle constituting the remaining part of the depth angle at the given point; and calculating the depth angle at the given point according to the minimum and maximum angles.

7. The method of claim 1, wherein the calculating depth angles step includes the steps of:

tracing the surface string from the origin toward the terminal;

calculating a supplement of adjacent segments on each side of a given point on the surface string;

calculating, if the supplement is negative, a maximum angle at the given point according to the supplement and a maximum angle already calculated at the preceding point;

tracing the surface string from the terminal toward the origin;

calculating a supplement of adjacent segments on each side of a given point on the surface string;

calculating, if the supplement is positive, a minimum angle at the given point according to the supplement and a minimum angle already calculated at the preceding point.

8. The method of claim 7, including the steps of:

tracing the surface string from the origin toward the terminal;

calculating a supplement of adjacent segments on each side of a given point on the surface string;

searching, if the supplement is positive, a range of the surface string, in which a depth angle at a point is determined by the preceding point, for a segment whose end point determines a depth angle for the given point;

recalculating the supplement according to the found segment and the given point;

calculating a maximum angle at the given point according to the recalculated supplement and a maximum angle already calculated at the end point of the found segment;

tracing the surface string from the terminal toward the origin;

calculating a supplement of adjacent segments on each side of a given point on the surface string;

searching, if the supplement is negative, a range of the surface string, in which a depth angle at a point is determined by the preceding point, for a segment whose end point determines a depth angle for the given point;

recalculating the supplement according to the found segment and the given point;

calculating a minimum angle at the given point according to the recalculated supplement and a minimum angle already calculated at the end point of the found segment.

9. The method of claim 8, including the steps of:

storing a segment in a segment list just after calculating a depth angle at an end point of the segment if the depth angle is calculated according to a start point of the segment during the finding of depth angles at all points on the surface string; and if a depth angle at a given point is not determined by the preceding point;

forming extensions from the segments stored in the segment list in a string tracing direction;

finding in the segment list adjacent two segments whose extensions define an area in which the given point is present according to a bisection method; and calculating a depth angle at the given point according to a node of the found two segments.

10. An apparatus for simulating a two-dimensional shape of a processing surface for a physical process that sends particles directly to the processing surface, comprising:

means for expressing a closed area containing the processing surface with strings composed of points and segments that extend between the points and extracting, from the strings, a surface string that represents the processing surface and extends between an origin and a terminal;

means for calculating depth angles at each of the points on tie surface string, each of the depth angles being an angle in which particles fly toward the corresponding point; and means for using the depth angles to simulate changes to occur in the two-dimensional shape of the processing surface due to the physical process, wherein the means for calculating depth angles comprises:

tracing means for tracing a string that represents the surface of a material from an origin to a terminal of the string;

calculating means for calculating a depth angle at each point on the string;

wherein, if the depth angle at a target point on the string is determined by the preceding point of the string, said means for calculating depth angles calculates the depth angle at the target point, and stores a segment between the target point and the preceding point to a segment list, and wherein, if the depth angle at the target point on the string is not determined by the preceding point of the string, said means for calculating depth angles finds a point that determines the depth angle for the target point in the segment list, and removes redundant segments from the segment list.

11. The apparatus of claim 10, wherein the physical process is a deposition process that deposits metal on the processing surface in a vacuum with the use of physical adsorption.

12. The apparatus of claim 10, wherein the physical process is a sputtering process that sputters metal on the processing surface.

13. The apparatus of claim 10, wherein the metal is refractory metal.

14. The apparatus of claim 10, wherein the physical process is a reactive ion etching process.

15. The apparatus of claim 10, wherein said means for calculating depth angles comprises:

first means for tracing points on the surface string from a given point toward the origin, to find a minimum of angles defined by the traced points and a reference line extending from the given point, and means for determining a maximum angle according to the minimum, the maximum angle constituting part of a depth angle at the given point;

second means for tracing points on the surface string from the given point toward the terminal, to find a maximum of angles defined by the traced points and the reference line, and determining a minimum angle according to the maximum, the minimum angle constituting the remaining part of the depth angle at the given point; and means for calculating the depth angle at the given point according to the minimum and maximum angles.

16. The apparatus of claim 10, wherein said means for calculating depth angles comprises:

means for tracing the surface string from the origin toward the terminal;

means for calculating a supplement of adjacent segments on each side of a given point on the surface string;

means for calculating, if the supplement is negative, a maximum angle at the given point according to the supplement and a maximum angle already calculated at the preceding point;

means for tracing the surface string from the terminal toward the origin;

means for calculating a supplement of adjacent segments on each side of a given point on the surface string; and means for calculating, if the supplement is positive, a minimum angle at the given point according to the supplement and a minimum angle already calculated at the preceding point.

17. The apparatus of claim 10, further comprising:

means for tracing the surface string from the origin toward the terminal;

means for calculating a supplement of adjacent segments on each side of a given point on the surface string;

means for searching, if the supplement is positive, a range of the surface string, in which a depth angle at a point is determined by the preceding point, for a segment whose end point determines a depth angle for the given point;

means for recalculating the supplement according to the found segment and the given point;

means for calculating a maximum angle at the given point according to the recalculated supplement and a maximum angle already calculated at the end point of the found segment;

means for tracing the surface string from the terminal toward the origin;

means for calculating a supplement of adjacent segments on each side of a given point on the surface string;

means for searching, if the supplement is negative, a range of the surface string, in which a depth angle at a point is determined by the preceding point, for a segment whose end point determines a depth angle for the given point;

means for recalculating the supplement according to the found segment and the given point; and means for calculating a minimum angle at the given point according to the recalculated supplement and a minimum angle already calculated at the end point of the found segment.

18. The apparatus of claim 10, further comprising:

means for storing a segment in a segment list just after calculating a depth angle at an end point of the segment if the depth angle is calculated according to a start point of the segment during the finding of depth angles at all points on the surface string; and if a depth angle at a given point is not determined by the preceding point;

means for forming extensions from the segments stored in the segment list in a string tracing direction;

means for finding in the segment list adjacent two segments whose extensions define an area in which the given point is present according to a bisection method; and means for calculating a depth angle at the given point according to a node of the found two segments.

* * * * *